(12) United States Patent
Kato

(10) Patent No.: US 7,285,042 B2
(45) Date of Patent: Oct. 23, 2007

(54) ELECTRONIC APPARATUS CASE HAVING VENTILATION SYSTEM

(75) Inventor: Nobuo Kato, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 0 days.

(21) Appl. No.: 10/842,689

(22) Filed: May 11, 2004

(65) Prior Publication Data

US 2004/0258451 A1    Dec. 23, 2004

(30) Foreign Application Priority Data

Jun. 20, 2003    (JP)    ............... 2003-177391

(51) Int. Cl.
*H05K 5/00*    (2006.01)

(52) U.S. Cl. ............ 454/184; 400/691; 400/693; 399/92; 399/94; 361/678; 361/692; 361/694; 454/49

(58) Field of Classification Search ........ 400/691–693; 399/91, 92–94; 454/290, 49, 184; 220/362.1; 361/678–681
See application file for complete search history.

(56) References Cited

U.S. PATENT DOCUMENTS

| | | | | |
|---|---|---|---|---|
| 4,528,469 A | * | 7/1985 | Prenner et al. .............. 310/59 |
| 4,600,326 A | * | 7/1986 | Fudatsuji et al. ........... 400/691 |
| 5,730,512 A | * | 3/1998 | Heirich ....................... 312/7.2 |
| 6,241,407 B1 | * | 6/2001 | Huggins et al. ............ 400/611 |
| 6,281,911 B1 | * | 8/2001 | Nakazawa et al. ........... 347/36 |
| 6,375,440 B2 | * | 4/2002 | Kosugi ................... 417/423.14 |
| 6,473,152 B1 | * | 10/2002 | Yokota ......................... 355/30 |
| 6,614,656 B1 | | 9/2003 | Huang |
| 6,648,532 B2 | | 11/2003 | Furuya et al. |
| 6,789,892 B2 | * | 9/2004 | Hetzer et al. ............... 347/108 |

FOREIGN PATENT DOCUMENTS

| | | | |
|---|---|---|---|
| EP | 0811902 | * | 10/1997 |
| EP | 1 307 081 A1 | | 5/2003 |
| JP | U-2-54286 | | 4/1990 |
| JP | A-2000-6481 | | 1/2000 |
| JP | A 2000-62251 | | 2/2000 |
| JP | A-2002-58128 | | 2/2002 |
| JP | A-2002-104717 | | 4/2002 |
| JP | A-2003-69264 | | 3/2003 |

* cited by examiner

*Primary Examiner*—Daniel J. Colilla
*Assistant Examiner*—Marissa Ferguson-Samreth
(74) *Attorney, Agent, or Firm*—Oliff & Berridge, PLC

(57) ABSTRACT

A case having a ventilation system for ventilating a heat generation source disposed in the case, includes: a first sub-case and a second sub-case which is joined to the first sub-case; a first gap provided in a surface of a joining section between the first sub-case and the second sub-case; and at least one ventilation section to discharge air in the case to the outside provided in the first gap.

17 Claims, 28 Drawing Sheets

ELECTRONIC APPARATUS CASE HAVING VENTILATION SYSTEM

BACKGROUND OF THE INVENTION

1. Field of Invention

The present invention relates to a case ventilation system and a print apparatus provided with the case ventilation system, and more particularly to a case ventilation system having a ventilation section to discharge air in the case to the outside, and a print apparatus provided within the case ventilation system.

2. Description of Related Art

Japanese Patent Application Laid-Open No. 2000-62251 discloses a tape print apparatus which prints characters or symbols on a tape pulled out from a tape cassette incorporating a long tape wound around a reel and cuts that tape to produce a label. This tape print apparatus accommodates components that generate heat, such as a thermal head for printing on the tape, a motor for driving a tape feeding roller for carrying the tape and the like, in its case. Therefore, the inside of the case is filled with heat from the thermal head or motor due to the driving of the tape print apparatus so that the temperature in the case rises. Thus, some tape print apparatus have a ventilation section in a side face of the case or the like in order to discharge air in the case to the outside. Further, in a laser printer, a fan may be provided on the side face of its case to execute forced ventilation of air from the case.

SUMMARY OF THE INVENTION

However, if the ventilation section is provided on the side face of the case, its location is restricted from viewpoints of design, and there is a further problem that the ventilation section needs to be provided with a screening member. There is another problem that the ventilation section cannot be provided at a place which compromises the design of the case even if it is a functionally favorable position. Additionally, the configuration and location of the ventilation section should be such that the ventilation system is not visible from the outside of the case. Such goals are often restricted by the relation of components contained in the case, or the structure of a mold die for forming the case.

It is one object of the present invention to provide a ventilation system for an apparatus having heat generating sources inside its case, and more particularly, a ventilation system for the case, and a print apparatus having such a case ventilation system, in which a ventilation section to discharge air in the case to the outside is provided, without compromising the design of the case, and without any restriction with respect to the internal structure of the case.

To achieve the above and/or other objects, according to an aspect of the present invention, there is provided a ventilation system for a case incorporating a heat generation source. The case has at least a first sub-case and a second sub-case which is joined to the first sub-case; a first gap is provided in a joining section between the first sub-case and the second sub-case; and a ventilation section is provided in the first gap to discharge air in the case to the outside of the case.

With this ventilation system for the case, ventilation within the case is enabled by the ventilation section provided in the first gap formed in the joining section between the first sub-case and the second sub-case constituting the case, so that air in the case warmed by the heat generating source can be discharged to the outside of the case.

In one exemplary embodiment, the first sub-case has a plurality of first engaging members, the second sub-case has a plurality of second engaging members which engage the first engaging members, and ventilation sections are provided between respective engaging sections in which the first engaging members engage the second engaging members.

In this exemplary embodiment, the first sub-case and the second sub-case are joined to each other by engagement between the first engaging member and the second engaging member, so that ventilation is carried out through the ventilation section provided between respective engaging sections in which the first engaging member engages the second engaging member. Further, preferably the ventilation section is formed from a space between respective engaging sections in which the first engaging members engage the second engaging members.

In this exemplary embodiment, ventilation is carried out through a space between the first engaging member and the second engaging member.

Preferably, the second sub-case is joined to a side face of the first sub-case, a second gap is formed between the side face of the first sub-case and a rear face of the second sub-case, and the second gap communicates with the ventilation section.

In this exemplary embodiment, warmed air is introduced to the ventilation section through the second gap formed between the side face of the first sub-case and the rear face of the second sub-case, and this air is ventilated to the outside.

In this exemplary embodiment, the ventilation section is a ventilation opening made in the side face of the first sub-case opposing the first gap.

According to another aspect of the present invention, there is provided a print apparatus incorporating at least a print device to print on a print object medium and a transfer motor which drives a carrying device to carry the print object medium in a case thereof The print device and the transfer motor are heat generating sources. The apparatus has at least a first sub-case and a second sub-case joined to the first sub-case, wherein a first gap is provided in a joining section between the first sub-case and the second sub-case, and a ventilation section is provided in the first gap to discharge air in the case to the outside of the case.

In a print apparatus having such a case ventilation system, ventilation within the case is enabled through the ventilation section provided in the first gap formed in the joining section between the first sub-case and second sub-case so that warmed air in the case caused by the print device and the transfer motor, which are heat generating sources, can be discharged to the outside.

In one exemplary embodiment, the first sub-case has a plurality of first engaging members, and the second sub-case has a plurality of second engaging members, each engaging first engaging members. The ventilation section is provided between respective engaging sections in which each first engaging member engages a second engaging member.

In this exemplary embodiment, the first engaging members and the second engaging members engage each other so that the first sub-case and the second sub-case are joined. Then, ventilation is carried out through the ventilation section provided between respective engaging sections in which the first engaging members engage the second engaging members.

As discussed above, the ventilation section is comprised of a space between the respective engaging sections in which the first engaging members engage the second engaging members across the first gap.

In this case, ventilation is carried out through the space between the respective engaging sections in which the first engaging members engage the second engaging members.

In another exemplary embodiment, the second sub-case is joined to the side face of the first sub-case, a second gap is formed between the side face of the first sub-case and the rear face of the second sub-case and the second gap communicates with the ventilation section.

In this case, warmed air is introduced to an introduction section through the second gap formed between the side face of the first sub-case and the rear face of the second sub-case, and this air is ventilated to the outside.

In one exemplary embodiment, the ventilation section is a ventilation opening made in the side face of the first sub-case opposing the first gap.

In this exemplary embodiment, warmed air is ventilated through the ventilation opening made in the side face of the first sub-case opposing the first gap.

Further, in this exemplary embodiment, the first sub-case accommodates at least the print device and the transfer motor and the second sub-case is joined to the side face of the first sub-case.

In this exemplary embodiment, air warmed by at least heat generated from the print device and the transfer motor accommodated in the first sub-case is discharged through the ventilation section provided between the side face of the first sub-case and the second sub-case joined thereto.

In another exemplary embodiment, a third sub-case is provided and is joined to the bottom section of the second sub-case and located under the print device and the transfer motor. An introduction section to introduce air from the outside is provided in a joining section between the second sub-case and the third sub-case, and the first gap and the ventilation section provided in the joining section between the first sub-case and second sub-case are disposed above the print device and the transfer motor.

In this exemplary embodiment, outside air is introduced through the introduction section provided in the joining section between the second sub-case and the third sub-case, and air warmed by the print device and transfer motor is discharged to the outside through the ventilation section in the first gap provided in the joining section between the first sub-case and second sub-case.

Further, in an exemplary embodiment the print object medium is a long tape and the print device is a thermal head, and the print apparatus may further have, as well as the transfer motor, a first cutter motor to drive a first cutter which cuts a tape after printing, a second cutter motor to drive a second cutter which incises a section other than a separation sheet adhering to the rear face of the tape after printing, and a discharge motor to drive a discharge roller which discharges a print object medium cut by the first cutter, the first cutter motor, the second cutter motor and the discharge motor being located above the introduction section in the first sub-case and below the first gap and the ventilation section.

In this case, air warmed by heat generated by the thermal head, transfer motor, first cutter motor, second cutter motor and discharge motor is discharged through the ventilation section.

BRIEF DESCRIPTION OF THE DRAWINGS

Exemplary embodiments of the invention will be described below in detail with reference to the accompanying drawings in which.

DETAILED DESCRIPTION OF EXEMPLARY EMBODIMENTS

Hereinafter, a tape print apparatus according to an exemplary embodiment of the present invention will be described with reference to the accompanying drawings. First, the structure of the tape print apparatus 1 of this embodiment will be described with reference to FIGS. 1-7.

Figure 1:
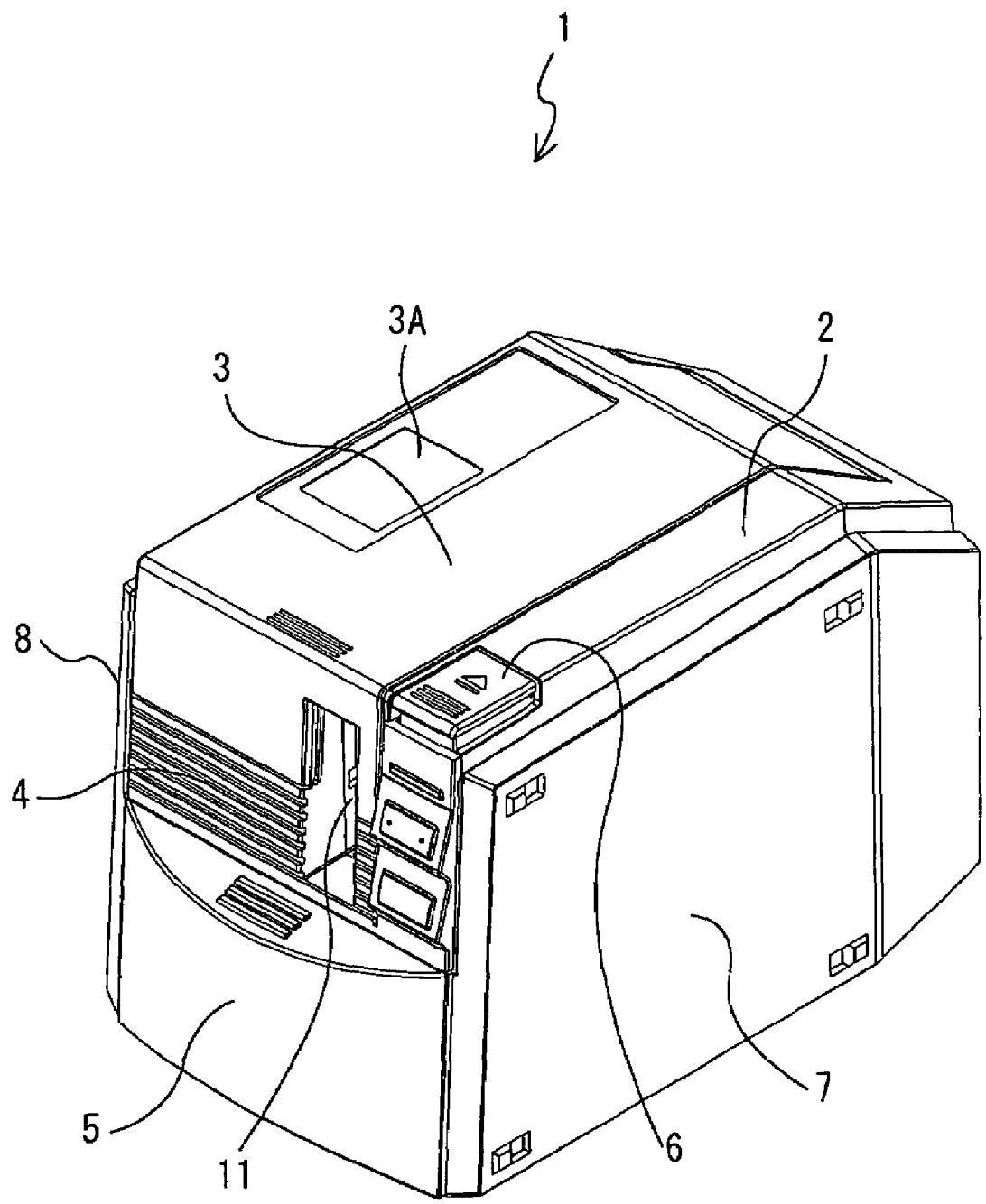
FIG. 1 is a perspective view of a tape print apparatus 1 of an exemplary embodiment of the invention.

The tape print apparatus 1 of this embodiment may be connected to a personal computer (not shown) or similar device that provides printing data and prints a desired character, graphic symbol or the like on tape to create a label according to a print instruction from the personal computer. As shown in FIG. 1, the case of this tape print apparatus 1 is substantially rectangular. The case may be made from any suitable material such as synthetic resin. The case has an intermediate cover 2 (first sub-case) acting as a frame, a cassette cover 3, journaled by the intermediate cover 2, and capable of opening/closing and covering the cassette accommodating section. A front cover 4 is provided on an upper section of a front face of the case and a tray cover 5 is provided below the front cover 4. Also provided are an open button 6 to open the cassette cover 3, a side cover 7 (second sub-case) and side cover 8 (second sub-case) to cover the right and left side faces of the case, a back cover 9 to cover the rear side of the case and a bottom cover 10 (third sub-case) to cover the bottom face of the case.

Figure 3:
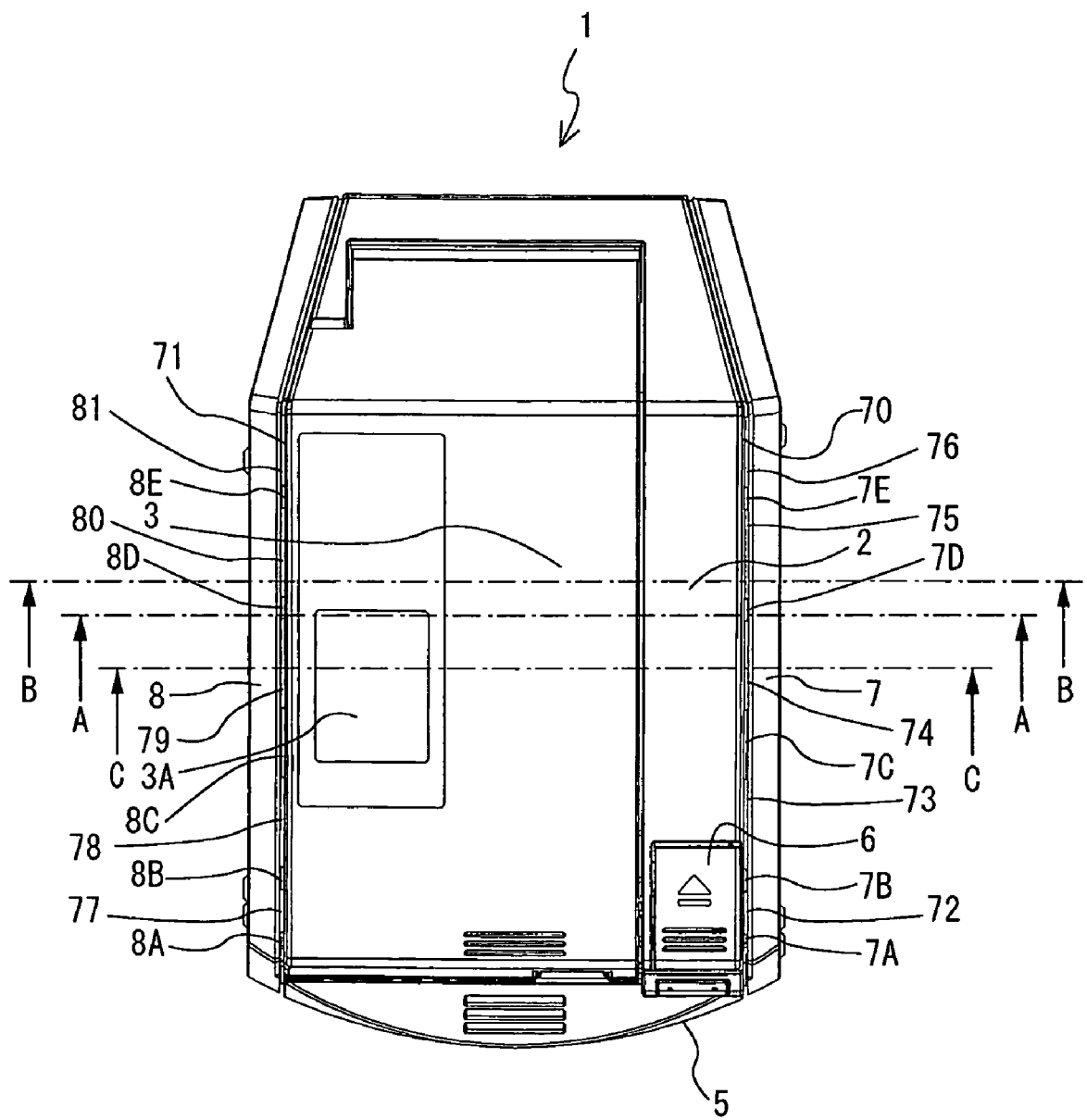
FIG. 3 is a plan view of the tape print apparatus 1 of an exemplary embodiment of the invention.

Next, the cassette cover 3 will be described. As shown in FIGS. 1 and 3, the cassette cover 3 is provided to cover the top face and an upper section of the front face of the tape print apparatus 1 and is formed in a substantially rectangular shape in plan view and in substantially L shape in side view. A rear end section of the cassette cover 3 is journaled by a top face of a rear end section of the intermediate cover 2 so that it is capable of opening/closing. A substantially rectangular check window 3A to check the remainder of a tape inside is provided to the left side in the center of the cassette cover 3. The cassette cover 3 is locked by a lock mechanism (not shown) provided on the intermediate cover 2 in a closed state and if the open button 6 is pressed, the lock is released so that the cassette cover can be opened/closed. A tape cassette accommodating section 20 is provided under this cassette cover 3 as described later.

Figure 2:
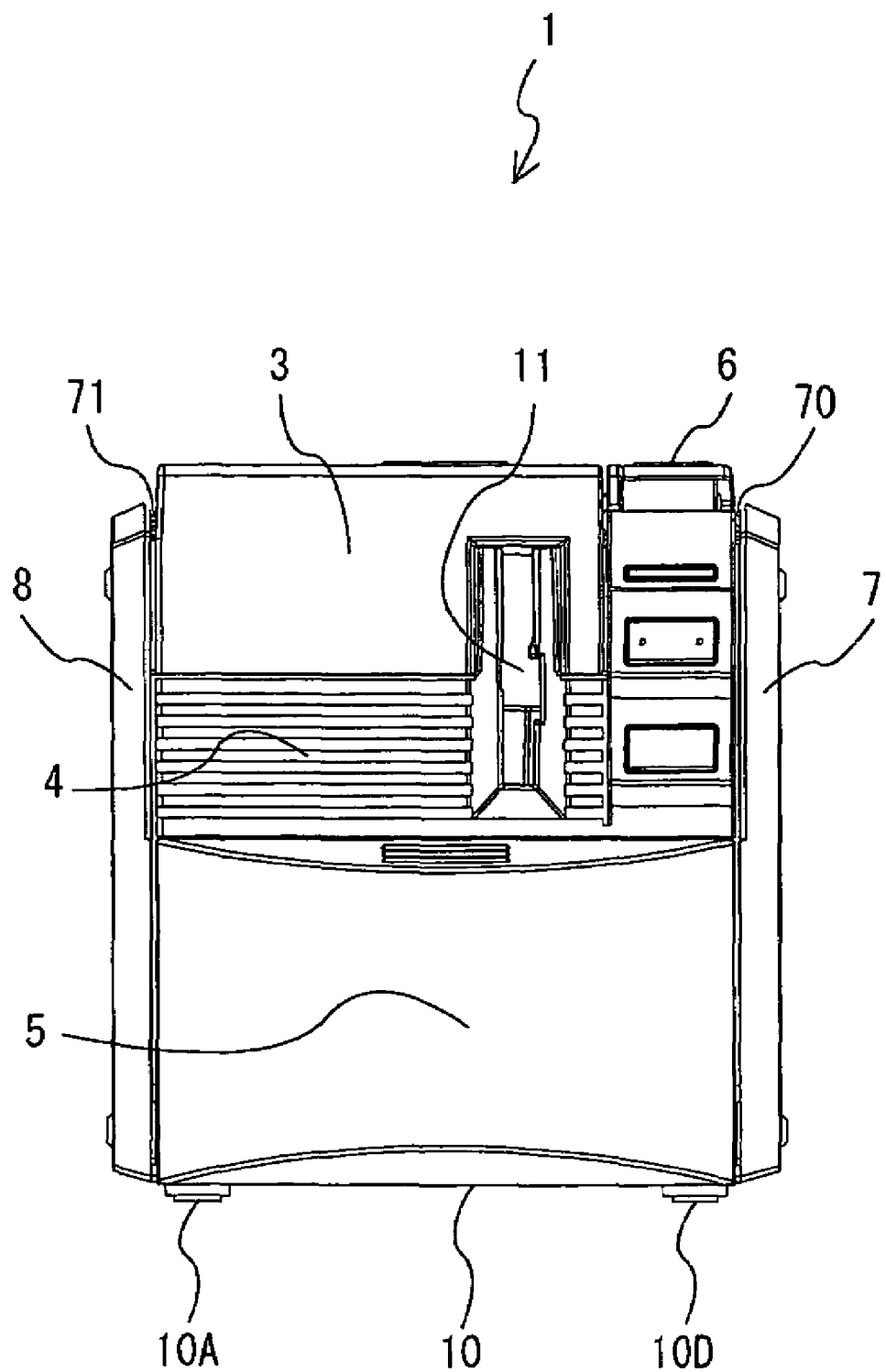
FIG. 2 is a front view of the tape print apparatus 1 of an exemplary embodiment of the invention.

Next, the front cover 4 and the tray cover 5 will be described. As shown in FIGS. 1 and 2, the front cover 4 is provided on a front face of the tape print apparatus 1, forms the front wall of the case and is joined to the intermediate cover 2. Six rows of grooves may be formed laterally in an upper section of the front cover 4 for decoration. Further, a vertically long, substantially rectangular tape discharge port 11 to discharge a printed tape T (see FIG. 10) is provided to the right in the center of the upper section of the front cover 4.

Next, the open button 6 will be described with reference to FIGS. 1 and 3. The open button 6 is provided at a front end section near the front cover 4 of the intermediate cover 2 and may be substantially rectangular. A slippage preventing rib may be formed on the top face of the open button 6. The open button 6 is provided with an urging member (not shown) to urge itself upward from the inside and a top of the open button 6 remains level with the top face of the intermediate cover 2 and can be pressed downward. If the open button 6 is pressed, a lock mechanism (not shown) to lock the cassette cover 3 and provided inside the intermediate cover 2 is released, so that the cassette cover 3 can be opened upward.

Figure 4:
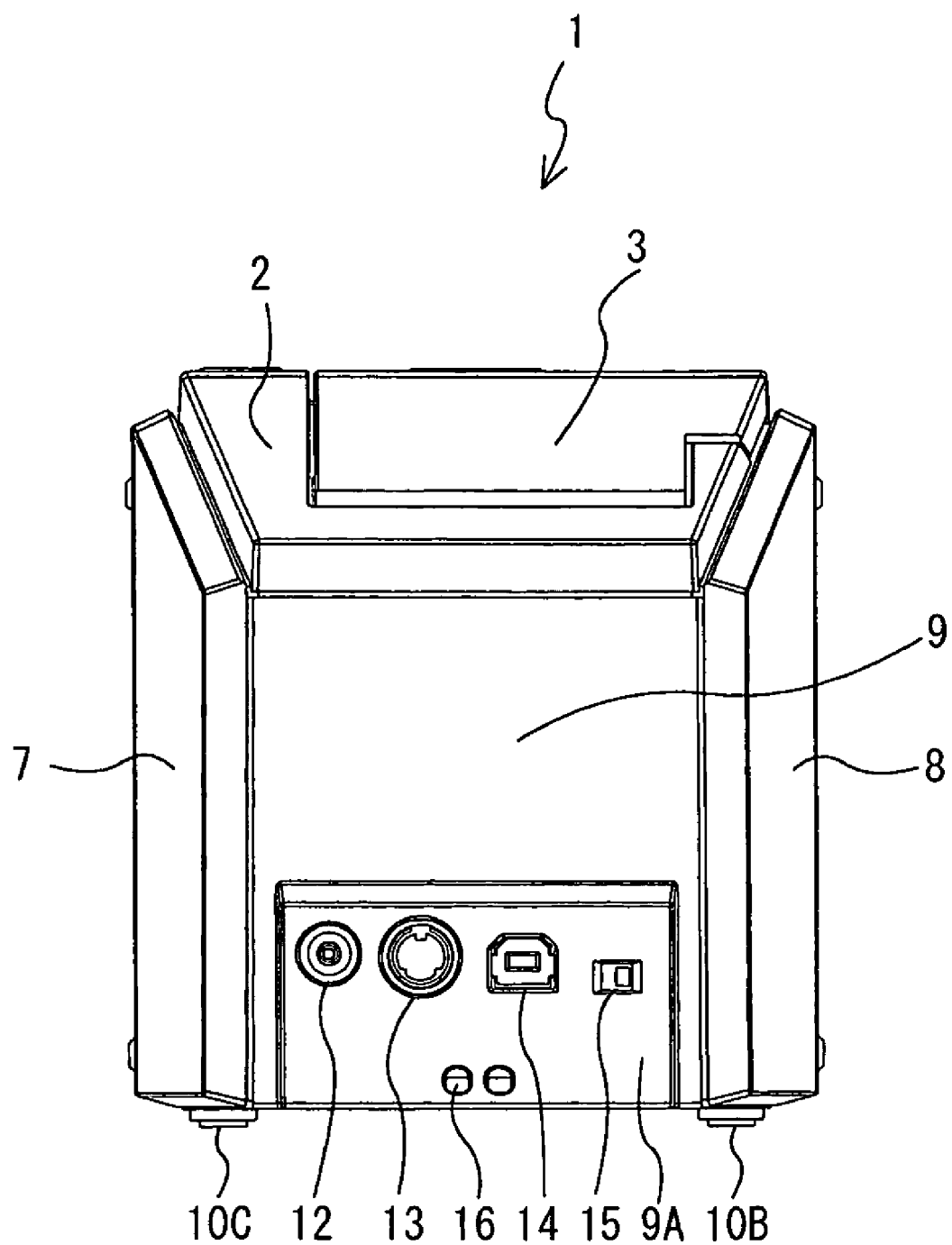
FIG. 4 is a rear view of a tape print apparatus 1 of an exemplary embodiment of the invention.
Figure 5:
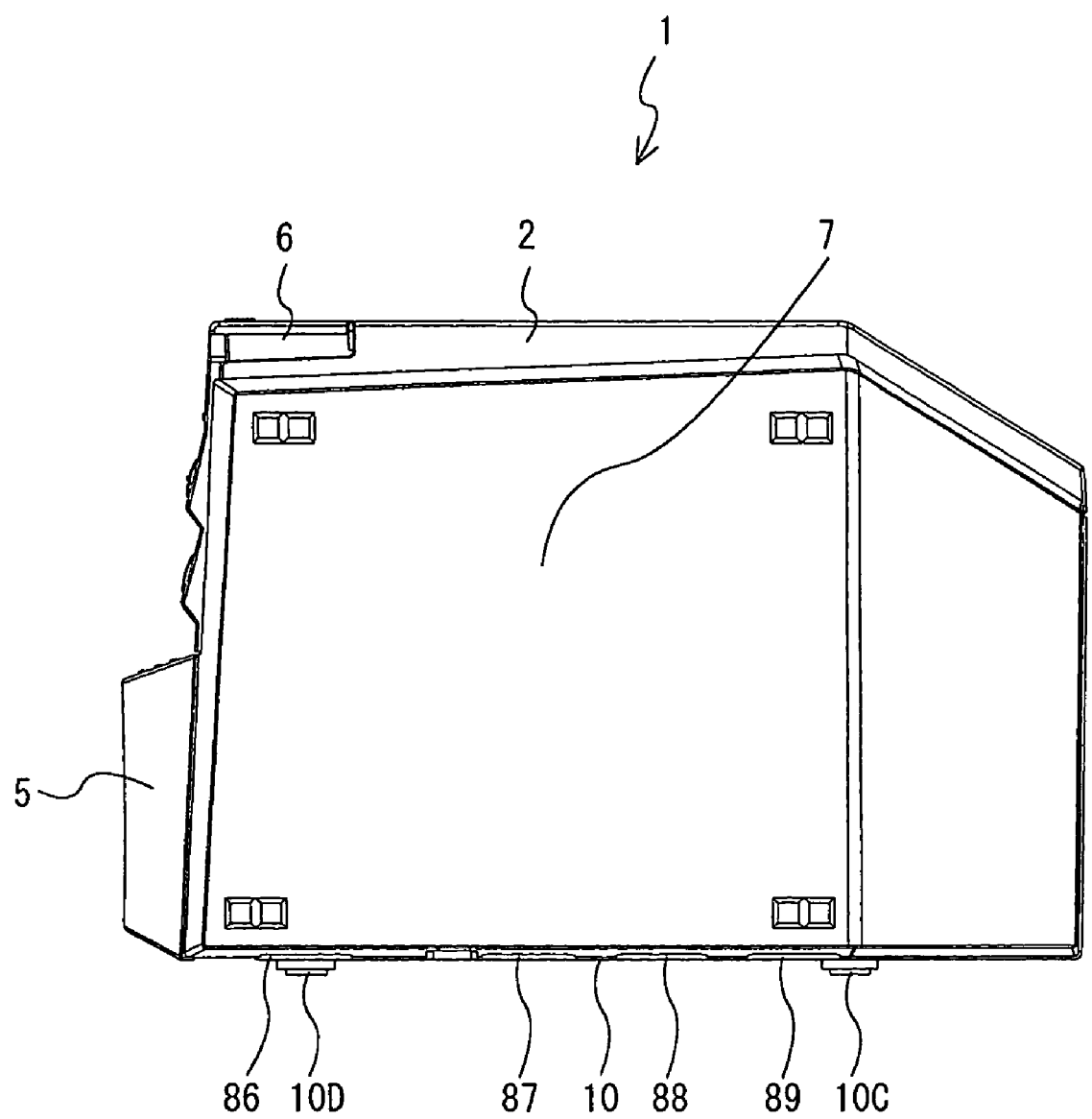
FIG. 5 is a right side view of a tape print apparatus 1 of an exemplary embodiment of the invention.
Figure 6:
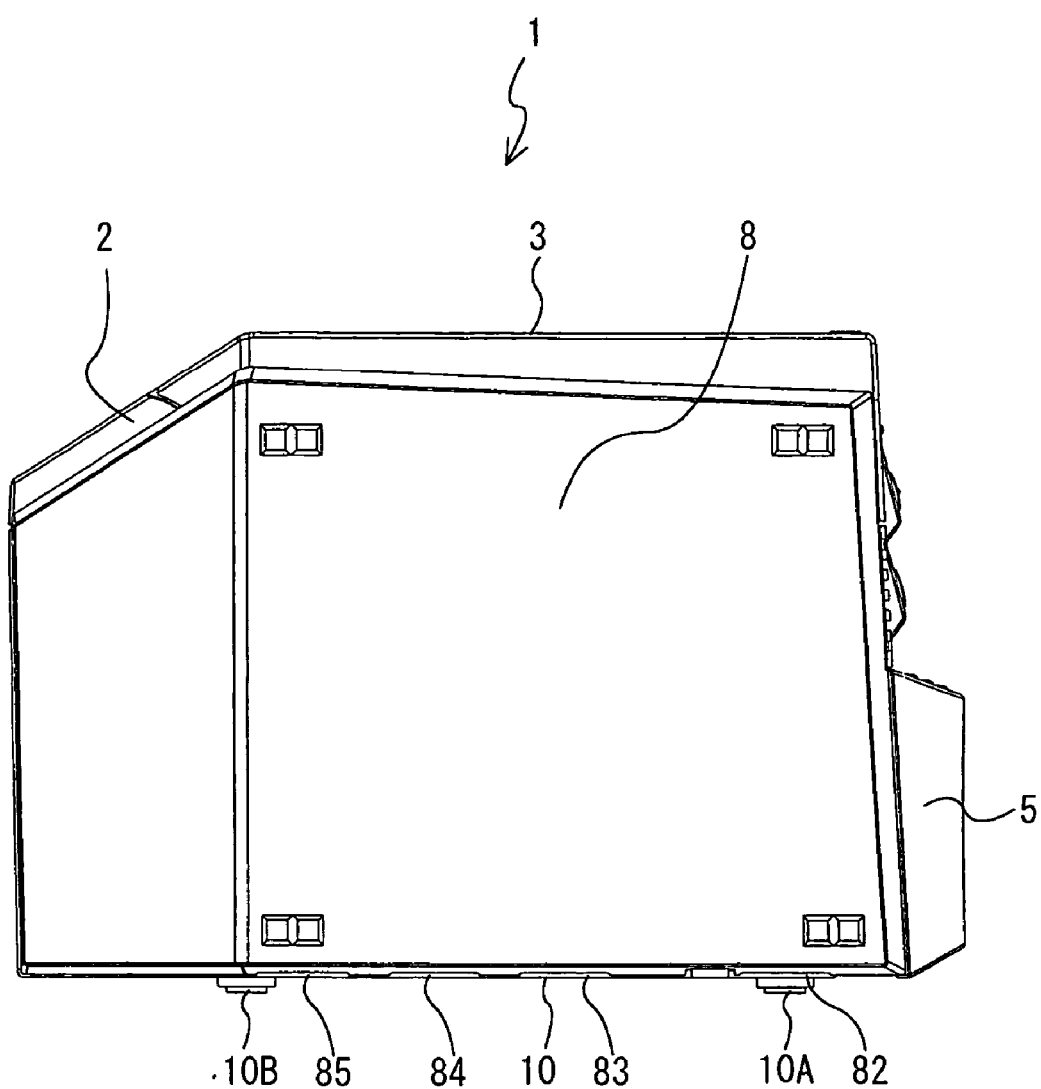
FIG. 6 is a left side view of a tape print apparatus 1 of an exemplary embodiment of the invention.

Next, the back cover 9 will be described with reference to FIG. 4. The back cover 9 may be formed integrally with the bottom cover 10 so that a substantially L shape in vertical section is formed in cooperation with the bottom cover 10. As shown in FIG. 4, the back cover 9 is formed in a substantially rectangular shape in its front view and may be joined to the intermediate cover 2 so that the rear face of the tape print apparatus 1 is covered. A connector connecting section 9A is provided on a lower half section of the back cover 9, as shown in FIG. 4. A power switch 12, a serial connector section 13, a USB connector section 14, a USB-ID changeover switch 15 and a robbery preventing hole 16, for example, may be provided on the connector connecting section 9A, as shown in FIG. 4.

As shown in FIGS. 1-5, a modified hexagonal side cover 7 having a sloped portion, whose side view is substantially rectangular with longer lateral sides, is joined to the right side face (right side in FIGS. 2, 3) of the tape print apparatus 1. Further, a modified hexagonal side cover 8 having a sloped portion, whose side view is substantially rectangular with longer lateral sides, is joined to the left side face of the tape print apparatus 1 (left side in FIGS. 2 and 3). The detailed structure of the side covers 7, 8 will be described later.

As shown in FIGS. 2 and 3, a gap 70 is formed in the joining section on the outer periphery of the tape print apparatus 1 between the intermediate cover 2 and the side cover 7. A gap 71 also is formed in the joining section on the outer periphery of the tape print apparatus 1 between the intermediate cover 2 and the side cover 8. As shown in FIG. 3, ventilation sections 72-76 to discharge air from the case of the tape print apparatus 1 to the outside are formed between engaging protrusions 7A-7E and engaging protrusions 23A-23E, which will be described later, in the gap 70. Further, ventilation sections 77-81 to discharge air from the case of the tape print apparatus 1 to the outside are provided between engaging protrusions 8A-8E and engaging protrusions 26A-26E in the gap 71.

Figure 7:
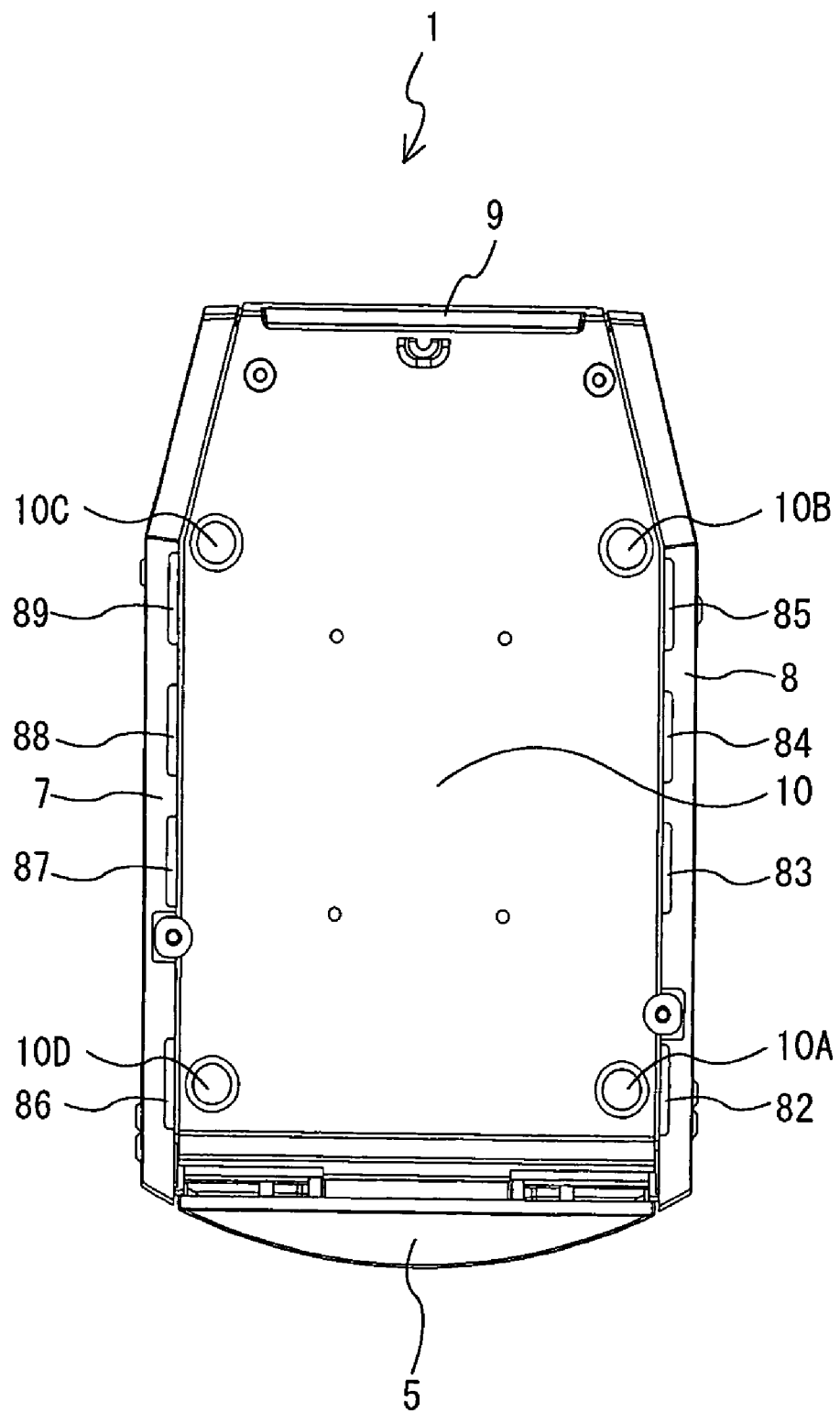
FIG. 7 is a bottom view of a tape print apparatus 1 of an exemplary embodiment of the invention.

Next, the bottom cover 10 formed integrally with the back cover 9 will be described with reference to FIG. 7. As shown in FIG. 7, the bottom cover 10 is provided to cover the bottom face of the tape print apparatus 1 and is formed in a modified hexagonal shape having a slope on a portion of the rectangle. Low, circular convex leg portions 10A-10D may be formed at four corners of that rectangle. Vent sections 86-89 to introduce air into the case from the outside are provided at joining sections between the bottom cover 10 and side cover 7. Further, vent sections 82-85 to introduce air into the case from the outside are provided in joining sections between the bottom cover 10 and side cover 8.

Figure 8:
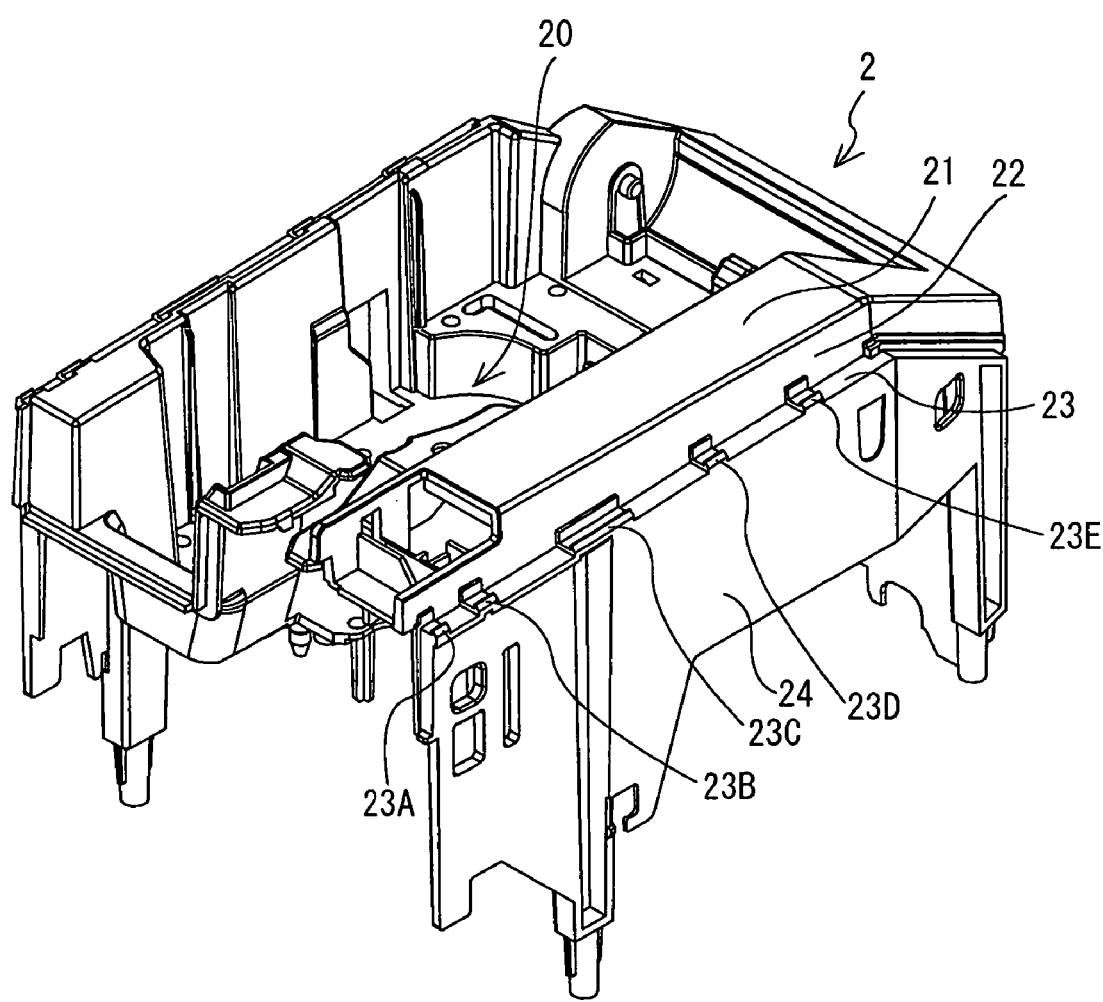
FIG. 8 is a perspective view of an intermediate cover 2.
Figure 9:
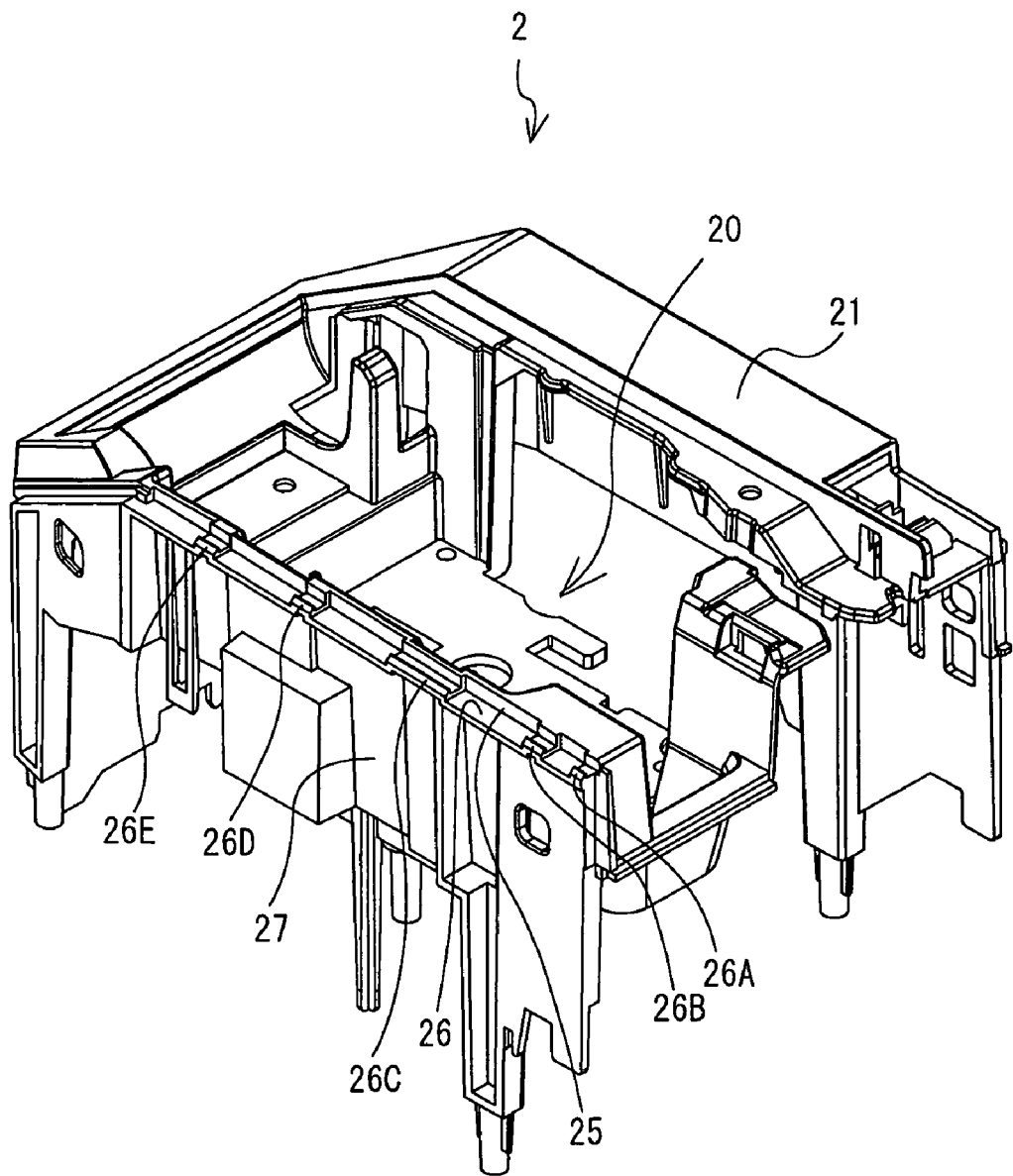
FIG. 9 is a perspective view of the intermediate cover 2.

Next, the structure of the intermediate cover 2 will be described with reference to FIGS. 8 and 9. FIGS. 8 and 9 are perspective views of the intermediate cover 2. The intermediate cover 2 may be formed of synthetic resin. A tape cassette accommodating section 20 to accommodate a tape cassette 30, which will be described later, is formed as a large depressed portion substantially in the center of the intermediate cover 2. A narrow rectangular top face section 21 is formed on a right side of the intermediate cover as shown in FIG. 8. As shown in FIG. 8, an upper side face 22 having a predetermined width (as an example, thickness of about 2 mm) extends downward from a right side of the top face section 21. A right side wall 24 forms the right side face of the intermediate cover 2. A horizontal section 23 (slightly inclined from rear to front of the intermediate cover 2) is formed horizontally from the top section of the right side wall 24 toward the center of the intermediate cover 2. Thus, the upper side face 22 and the horizontal section 23 intersect with each other at a right angle.

As shown in FIG. 8, engaging protrusions 23A-23E, which engage engaging protrusions provided on the side cover 7, which will be described later, are provided on the horizontal section 23 to protrude upward at intervals. Of these, engaging protrusion 23C is formed wider than the others.

As shown in FIG. 9, an upper side face 25 having a predetermined width (for example, a thickness of about 2 mm) extends downward from a top end section of a left side wall 27 of the intermediate cover 2 and a horizontal section 26 (slightly inclined from rear to front of the intermediate cover) is formed from a bottom end section of the upper side face 25. Therefore, the upper side face 25 and horizontal section 26 intersect each other. As shown in FIG. 9, engaging protrusions 26A-26E, which engage engaging protrusions provided on the side cover 8, which will be described later, protrude upward from the horizontal section 26 at intervals. Of these, engaging protrusion 26C is formed wider than the others.

Figure 10:
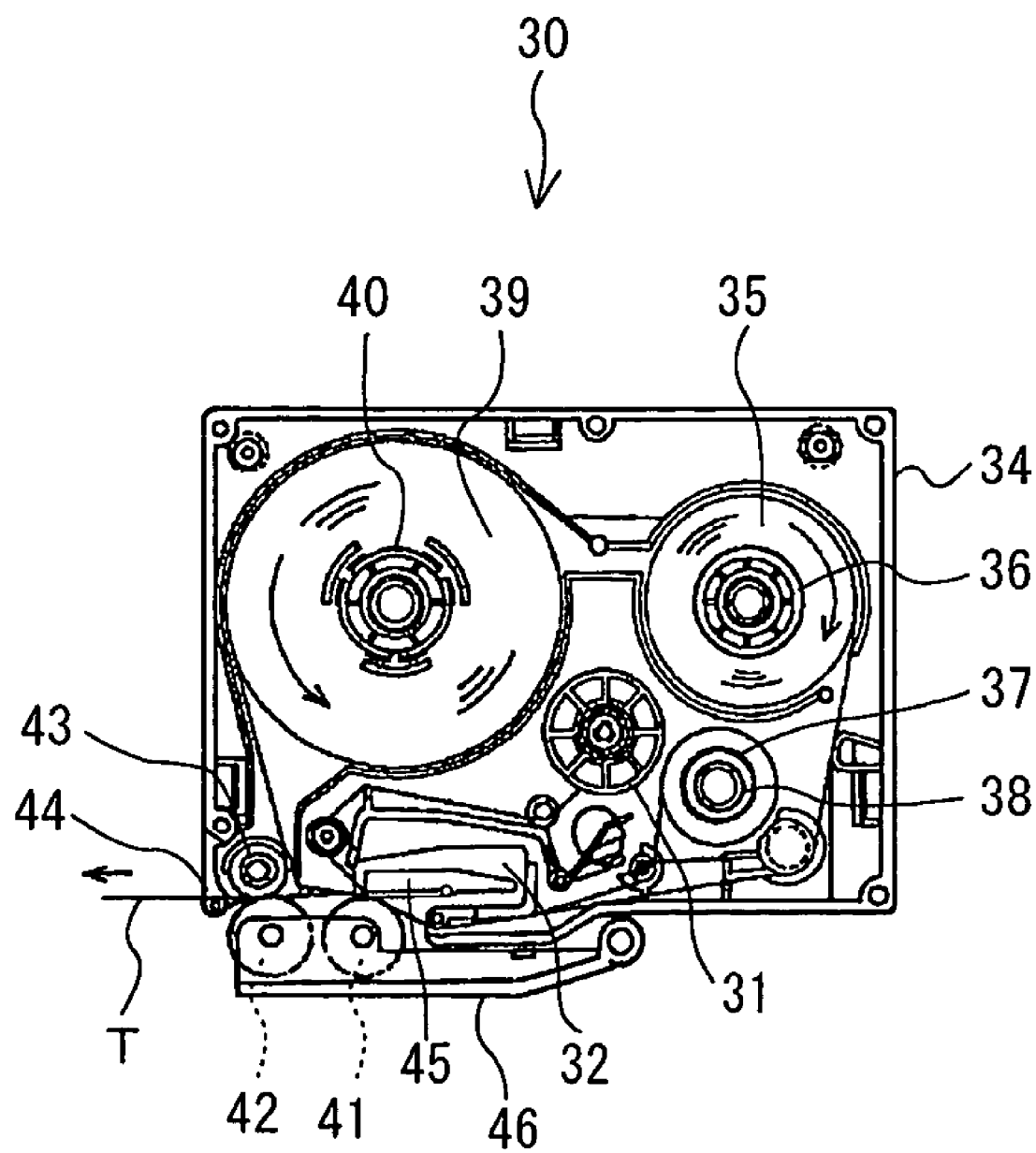
FIG. 10 is a plan view of a state in which the top case of a tape cassette 30 is removed.

Next, the structure of a tape cassette 30 that is accommodated in the tape cassette accommodating section 20 will be described. FIG. 10 is a plan view of a state when an upper case of the tape cassette 30 has been removed. In the tape cassette 30, as shown in FIG. 10, components which will be described later, are incorporated in a lower case 34 which is formed in a flat, substantially rectangular, box-like configuration. In the lower case 34, a tape spool 36 on which a transparent film tape 35 is wound, a ribbon spool 38 on which a thermal ink ribbon 37 is wound, and an adhesive tape spool 40 on which a double-sided adhesive tape 39 with separation sheet is wound with the separation sheet facing outside, are disposed. These respective spools 36, 38, 40 are supported rotatably in cooperation with a supporting section provided on a bottom face of a upper case (not shown).

Further, a ribbon winding spool 31 is supported rotatably among the respective spools 36, 38, 40 and used to wind the thermal ink ribbon 37 which is used for print.

A thermal head 45 is disposed in a concave section 32 provided in the lower case 34. A platen roller 41 is supported rotatably by a roller holder 46 and disposed at a position allowing it to be in firm contact with the thermal head 45. The thermal head 45 has a plurality of heat generating elements and is able to print characters or the like, on a film tape 35 through a thermal ink ribbon 37.

A tape pressing roller 43 is supported rotatably in the vicinity of a tape discharge section 44 (down to the left in FIG. 3) of the lower case 34. A tape feed roller 42 to feed a completed tape T in the direction indicated by an arrow in FIG. 10 and supported rotatably by the roller holder 46, is disposed at a position so as to make firm contact with the tape T so that it is urged toward the tape pressing roller 43.

Figure 11:
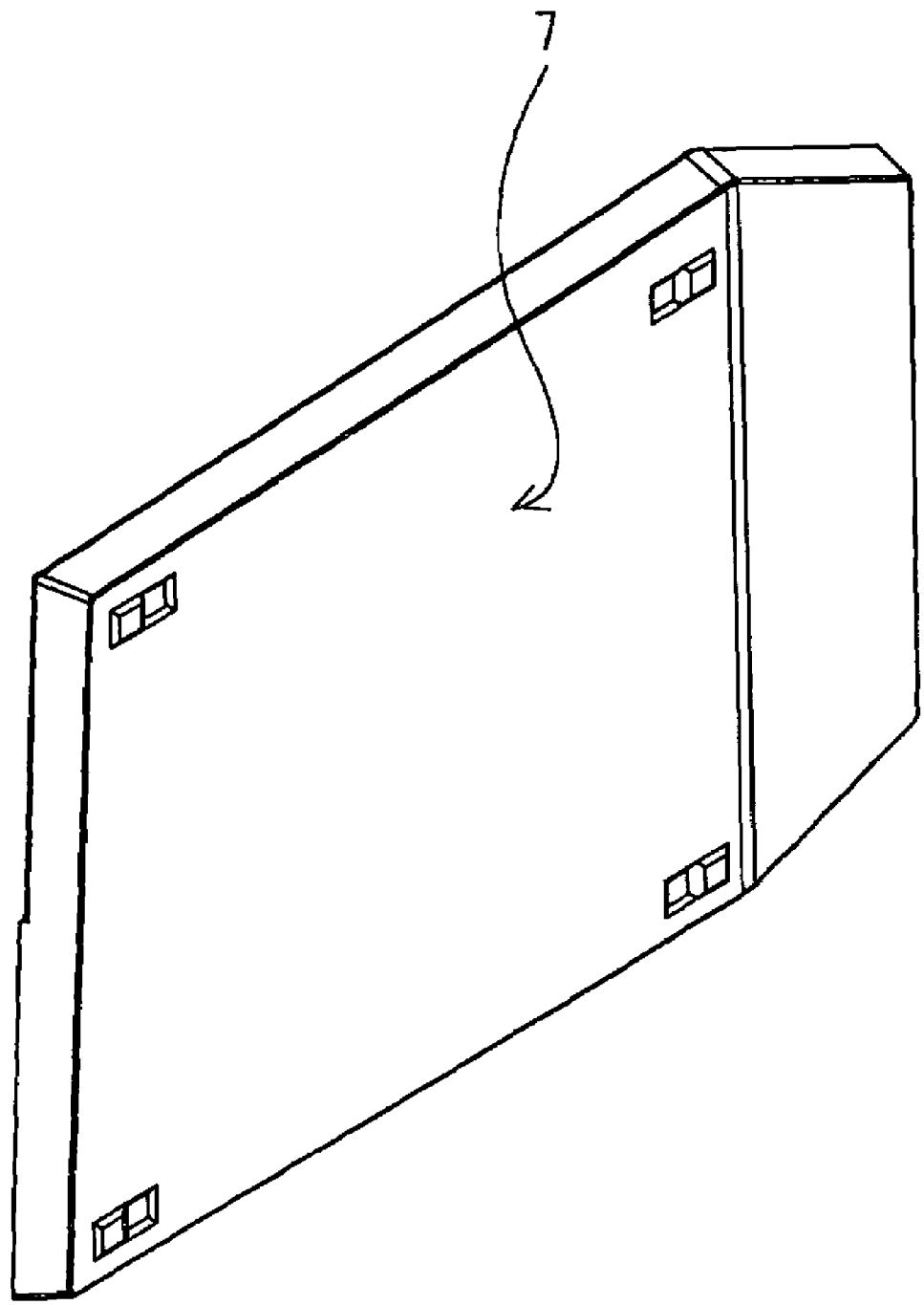
FIG. 11 is a perspective view when the side cover 7 is seen from the front side.
Figure 12:
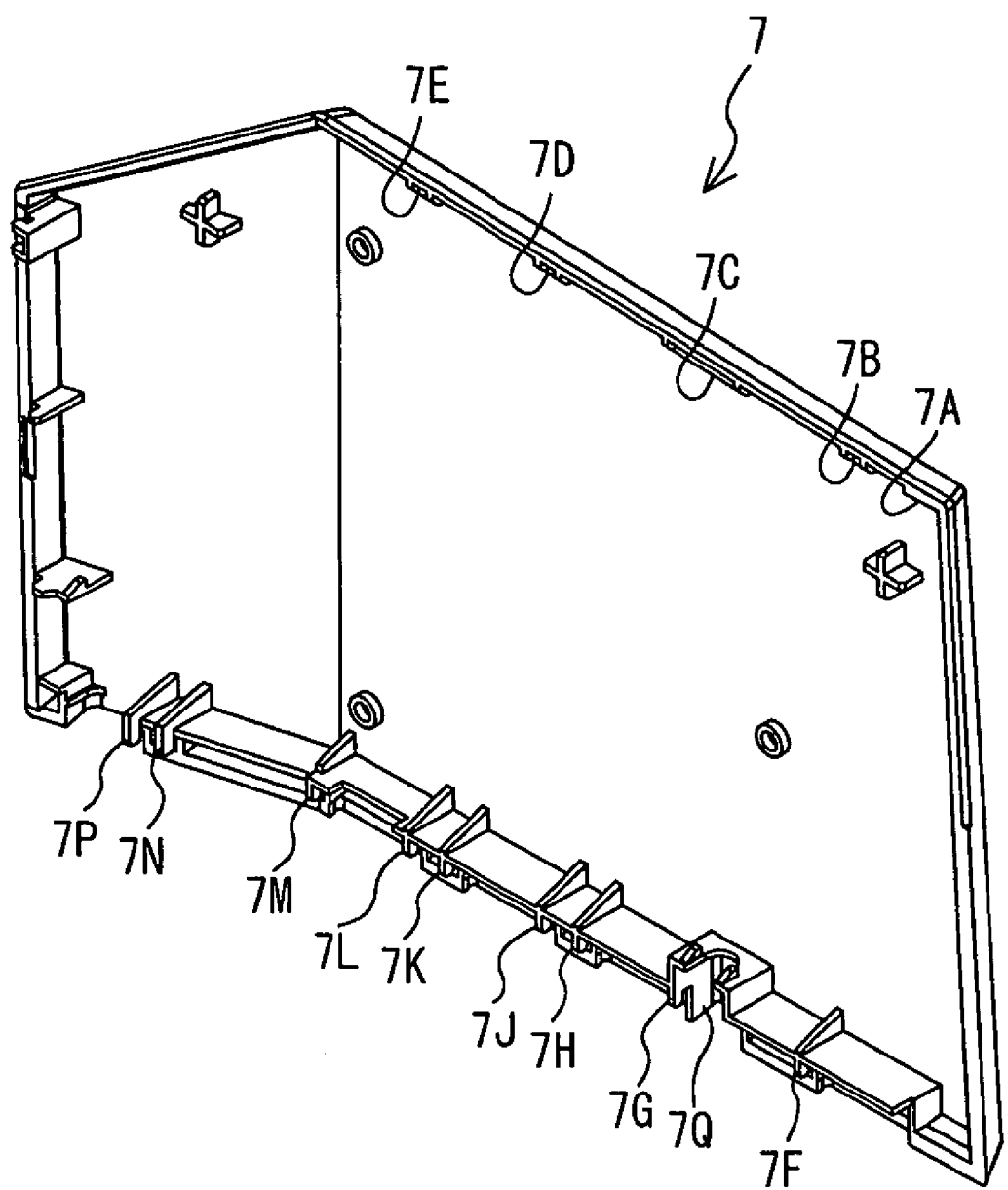
FIG. 12 is a perspective view when the side cover 7 is seen from the rear side.

Next the structure of the side cover 7 will be described with reference to FIGS. 11 and 12. FIG. 11 is a perspective view of the side cover 7 from the front side. FIG. 12 is a perspective view of the side cover 7 from the rear side. As shown in FIGS. 11 and 12, the side cover 7 is rectangular with longer lateral sides and may be made of synthetic resin and formed into a modified hexagonal configuration having a sloped portion. Engaging protrusions 7A-7E, which engage the engaging protrusions 23A-23E (see FIG. 8) provided on the top section of the right side wall 24 of the intermediate cover 2, are provided on top end sections of the rear face of the side cover 7 so that they project downward, as shown in FIG. 12. Further, engaging protrusions 7F-7Q, which engage the bottom cover 10, protrude from the bottom end section of the rear face of the side cover 7.

Figure 13:
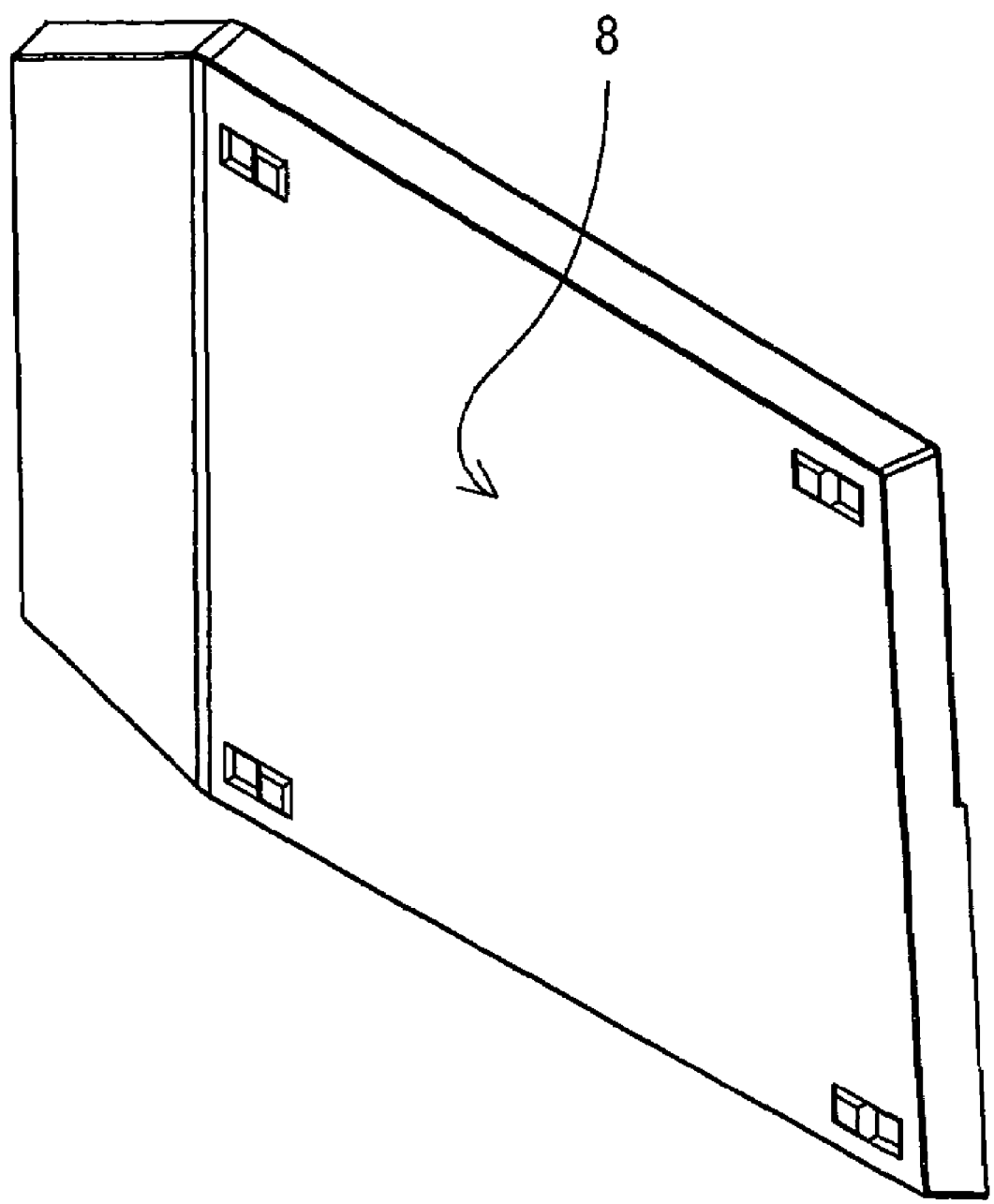
FIG. 13 is a perspective view when the side cover 8 is seen from the front side.
Figure 14:
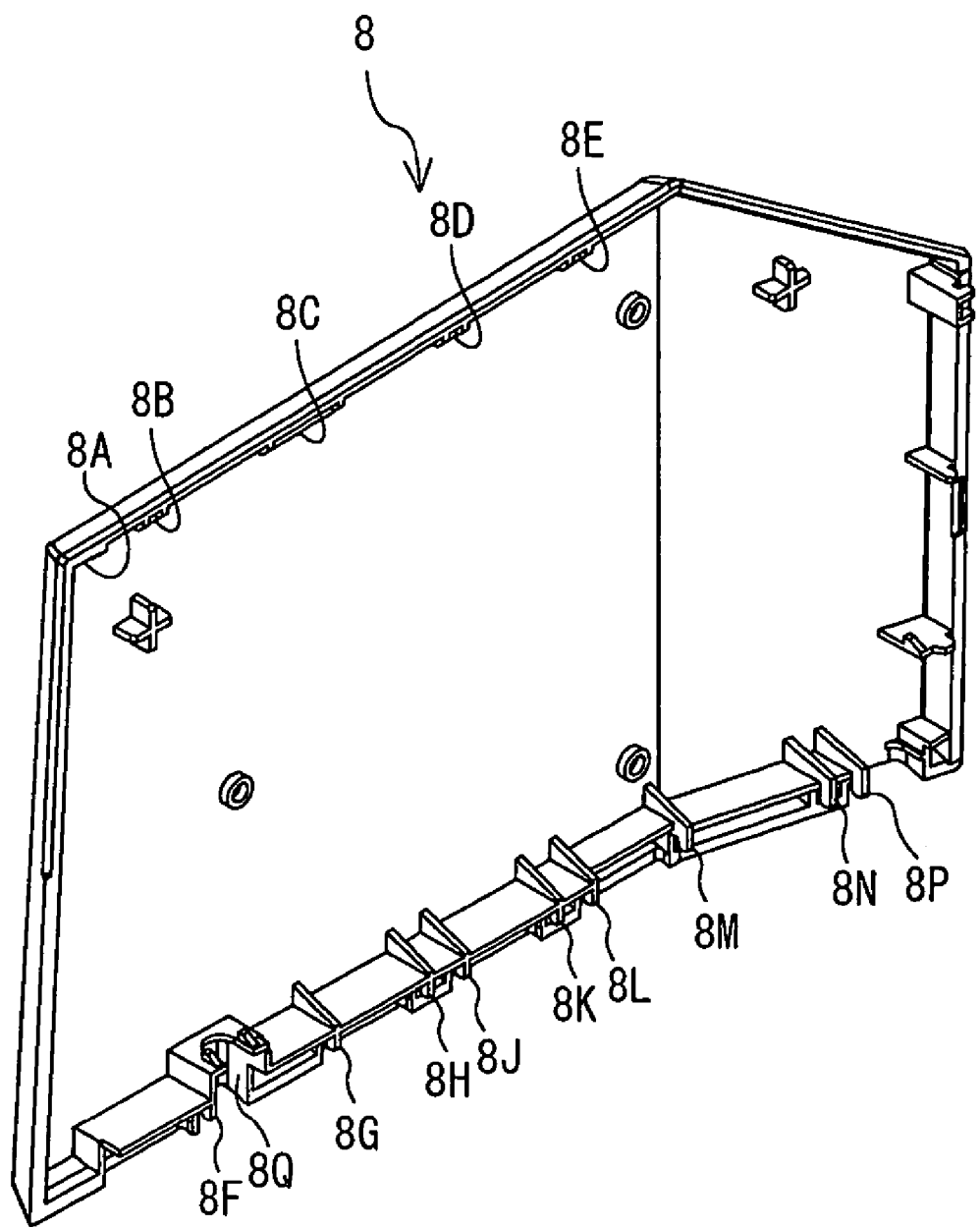
FIG. 14 is a perspective view when the side cover 8 is seen from the rear side.

Next, the structure of the side cover 8 will be described with reference to FIGS. 13 and 14. FIG. 13 is a perspective view of the side cover 8 from the front side and FIG. 14 is a perspective view of the side cover 8 from the rear side. As shown in FIGS. 13 and 14, the side cover 8 is rectangular with longer lateral sides and may be made of synthetic resin and formed into a modified hexagonal configuration having a sloped portion. Engaging protrusions 8A-8E, which engage the engaging protrusions 26A-26E provided on the top section of the left side wall 27 of the intermediate cover 2, are provided on top end sections of the rear face of the side cover 8 so that they project downward, as shown in FIG. 13. Further, engaging protrusions 8F-8Q, which engage the bottom cover 10, protrude from the bottom end section of the rear face of the side cover 8.

Figure 15:
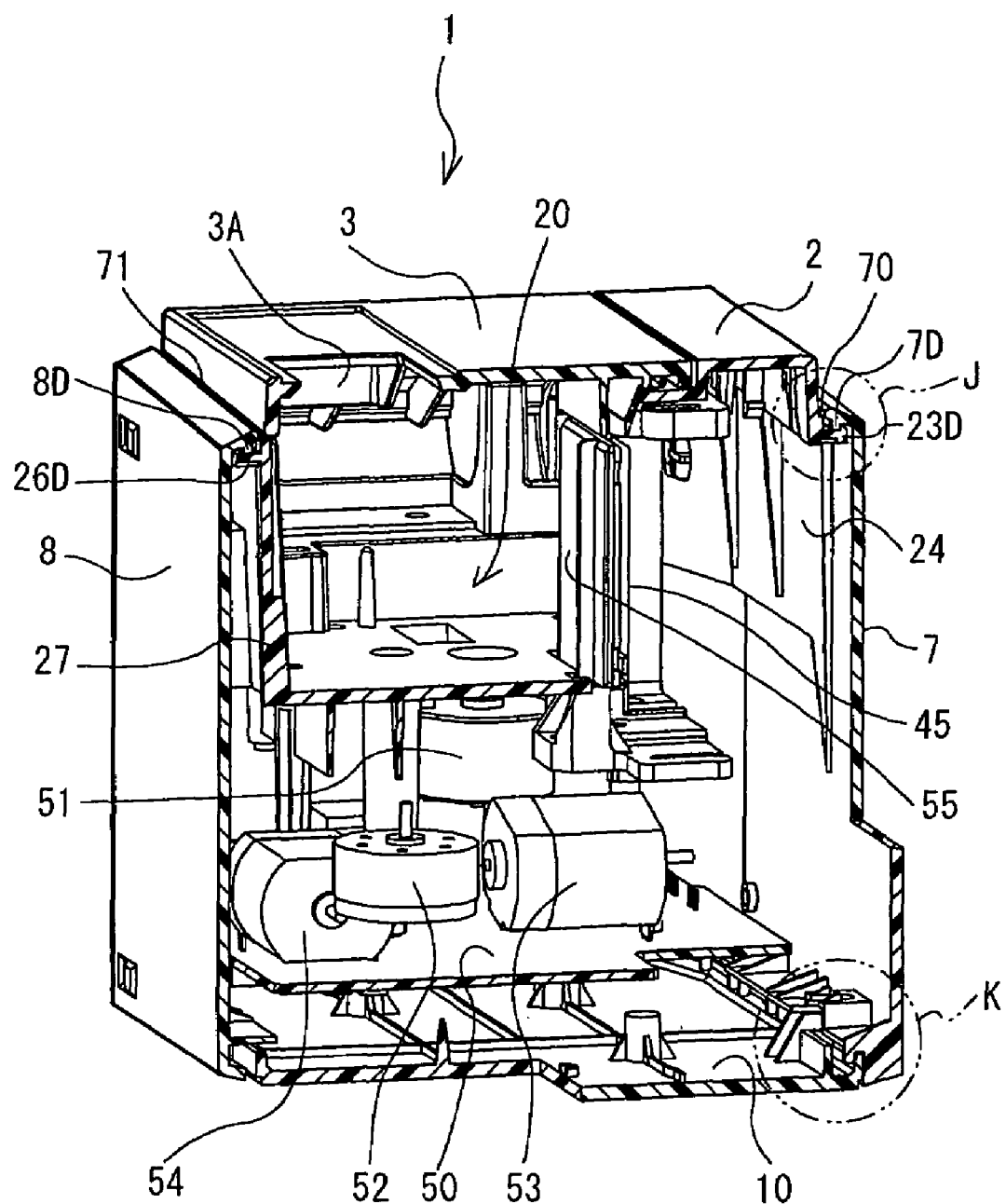
FIG. 15 is a sectional view taken along the plane A-A of the tape print apparatus 1 shown in FIG. 3.

Next, the internal structure of the tape print apparatus 1 will be described with reference to FIG. 15. FIG. 15 is a sectional view taken along the plane A-A of the tape print apparatus 1 shown in FIG. 3. A print circuit board 50, in which an electronic circuit is formed, is fixed substantially horizontally with an appropriate fixing device inside the respective covers above the bottom cover 10 of the tape print apparatus 1, as shown in FIG. 15. A tape feeding motor 51 to generate a driving force for feeding the tape T inside the tape cassette 30 is provided under the bottom face of the tape cassette accommodating section 20 and a thermal head 45 and a heat sink 55 are provided on the right side face of the tape cassette accommodating section 20 in FIG. 15. A full cutter motor 53 is provided to drive a full cutter (not shown) which cuts a printed tape T. A half cutter motor 54 is provided to drive a half cutter, (not shown) which incises a section other than the separation sheet in the tape T, after a print and a tape discharge motor 52 to drive a tape discharge roller (not shown) which discharges the tape T, after cutting from the tape discharge port 11. The full cutter motor 53, half cutter motor 54 and the tape discharge motor 52 are provided between the tape cassette accommodating section 20 and the print circuit board 50. The tape feeding motor 51, tape discharge motor 52, full cutter motor 53 and half cutter motor 54 are held on an inner frame (not shown).

Because the thermal head 45, tape feeding motor 51, tape discharge motor 52, full cutter motor 53 and half cutter motor 54 are heat sources which generate heat during their operations, the case of the tape print apparatus 1 becomes filled with heat generated from these heat sources.

Next, the ventilation system for air warmed by heat generated from the above mentioned heat sources will be described with reference to FIGS. 3, 7 and 15-28.

The gap 70 is formed in the surface of the joining section between the side face of the intermediate cover 2 and the top section of the side cover 7. Respective engaging sections having the engaging protrusions 7A-7E and the engaging protrusions 23A-23E exist in the gap 70 and the ventilation sections 72-76 to discharge air in the case to the outside are formed between the respective engaging sections. Further, the gap 71 is formed in the surface of the joining section between the side face of the intermediate cover 2 and the top section of the side cover 8. Respective engaging sections having the engaging protrusions 8A-8E and the engaging protrusions 26A-26E exist in the gap 71 and the ventilation sections 77-81 to discharge air in the case to the outside are formed between the respective engaging sections.

As shown in FIG. 7, introduction sections 86-89 to introduce air into the case from the outside are formed in the joining section between the bottom cover 10 and the side cover 7 off the engaging sections in which the engaging protrusions 7F-7Q of the side cover engage the bottom cover 10. Introduction sections 82-85 to introduce air into the case from the outside are formed in the joining section between the bottom cover 10 and the side cover 8 of the engaging sections in which the engaging protrusions 8F-8Q of the side cover 8 engage the bottom cover 10.

Figure 16:
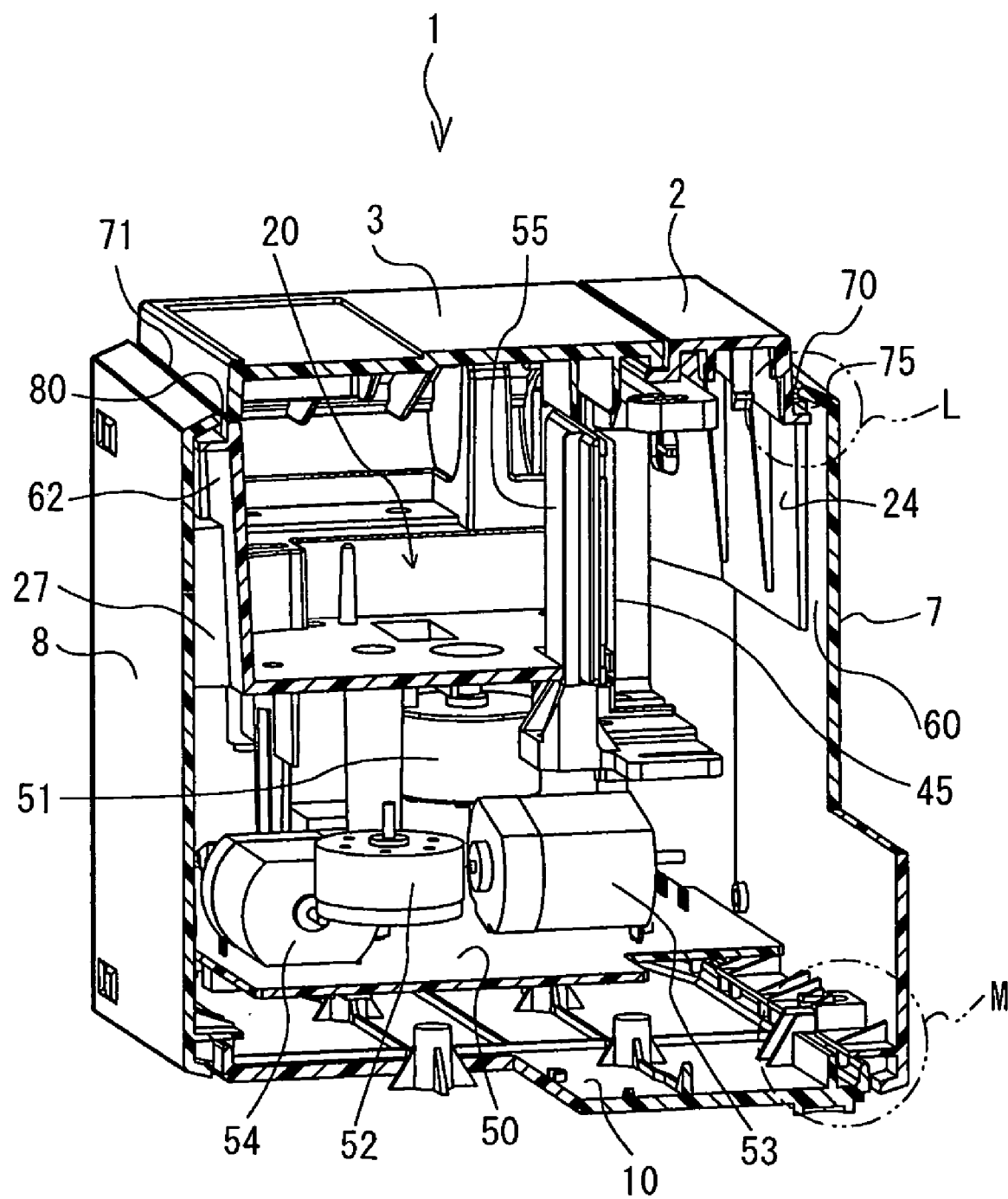
FIG. 16 is a sectional view taken along the plane B-B of the tape print apparatus shown in FIG. 3.
Figure 17:
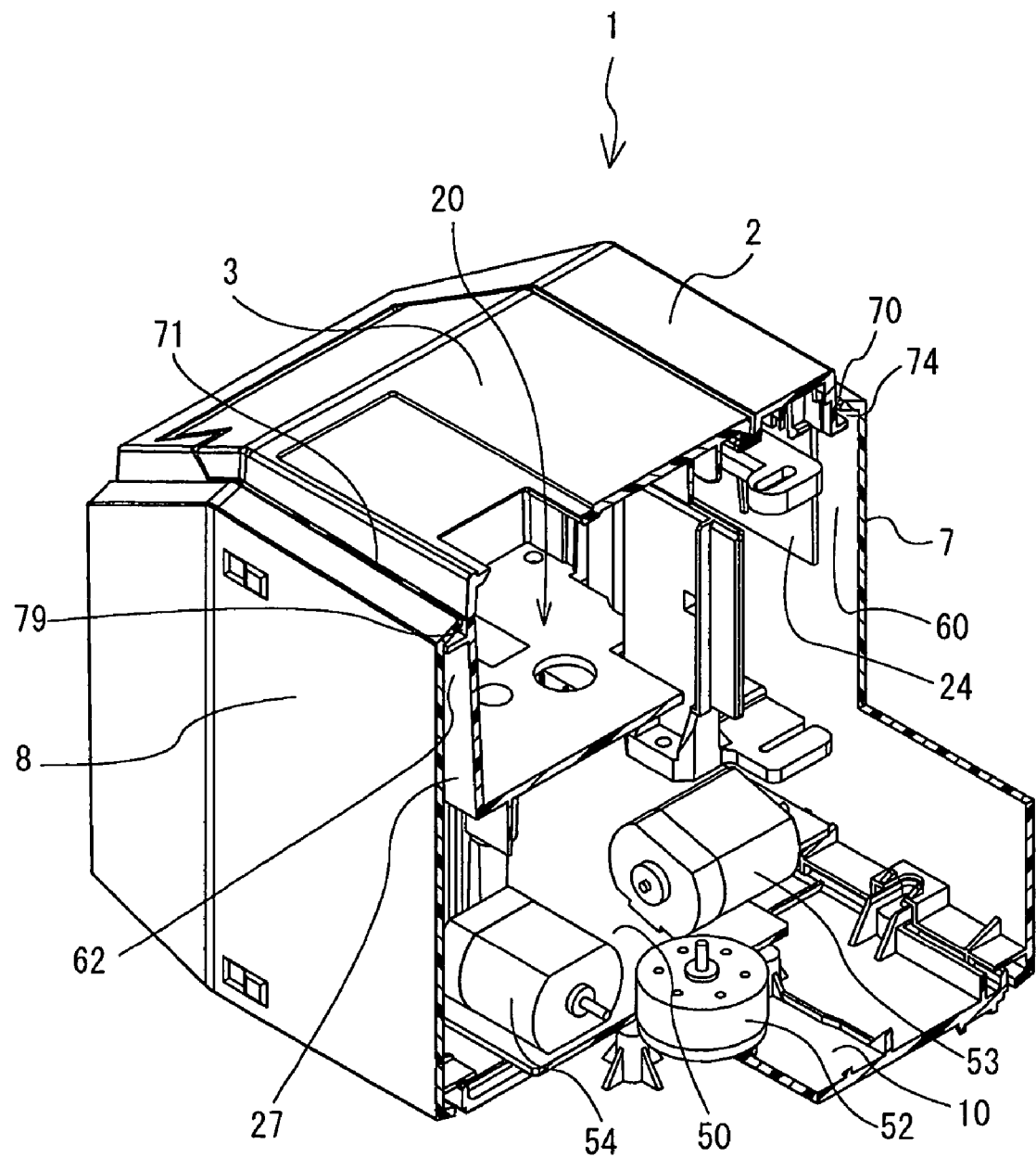
FIG. 17 is a sectional view taken along the plane C-C of the tape print apparatus shown in FIG. 3.

Further, as shown in FIGS. 16 and 17, a gap 60, which functions as an exhaust duct to introduce air warmed in the case to the ventilation sections 72-76, is formed between the right side wall 24 of the intermediate cover 2 and the rear face of the side cover 7. A gap 62, which functions as an exhaust duct to introduce air warmed in the case to the ventilation sections 72-76, is formed between the left side wall 27 of the intermediate cover 2 and the rear face of the side cover 8.

Figure 18:
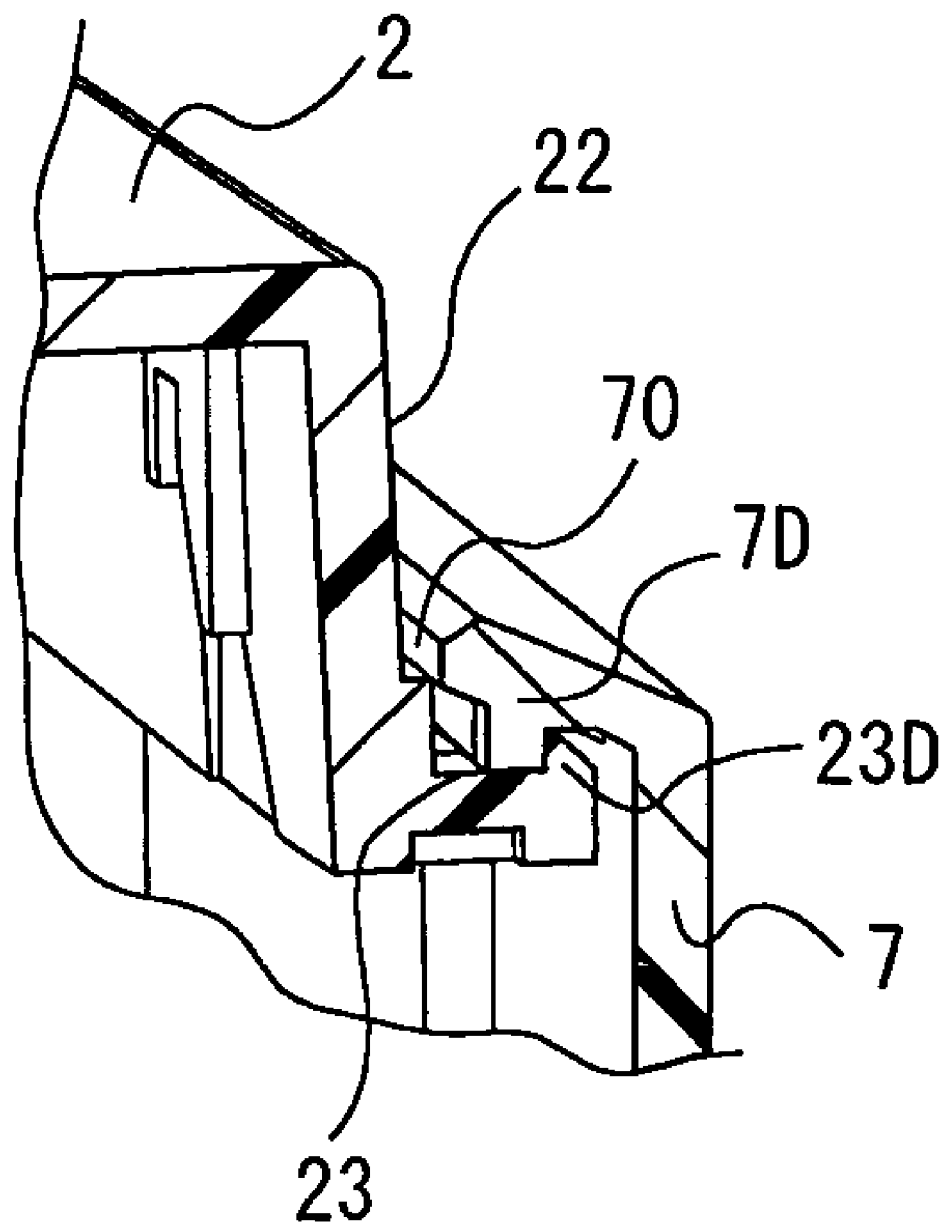
FIG. 18 is an enlarged view of a section J in FIG. 15.
Figure 23:
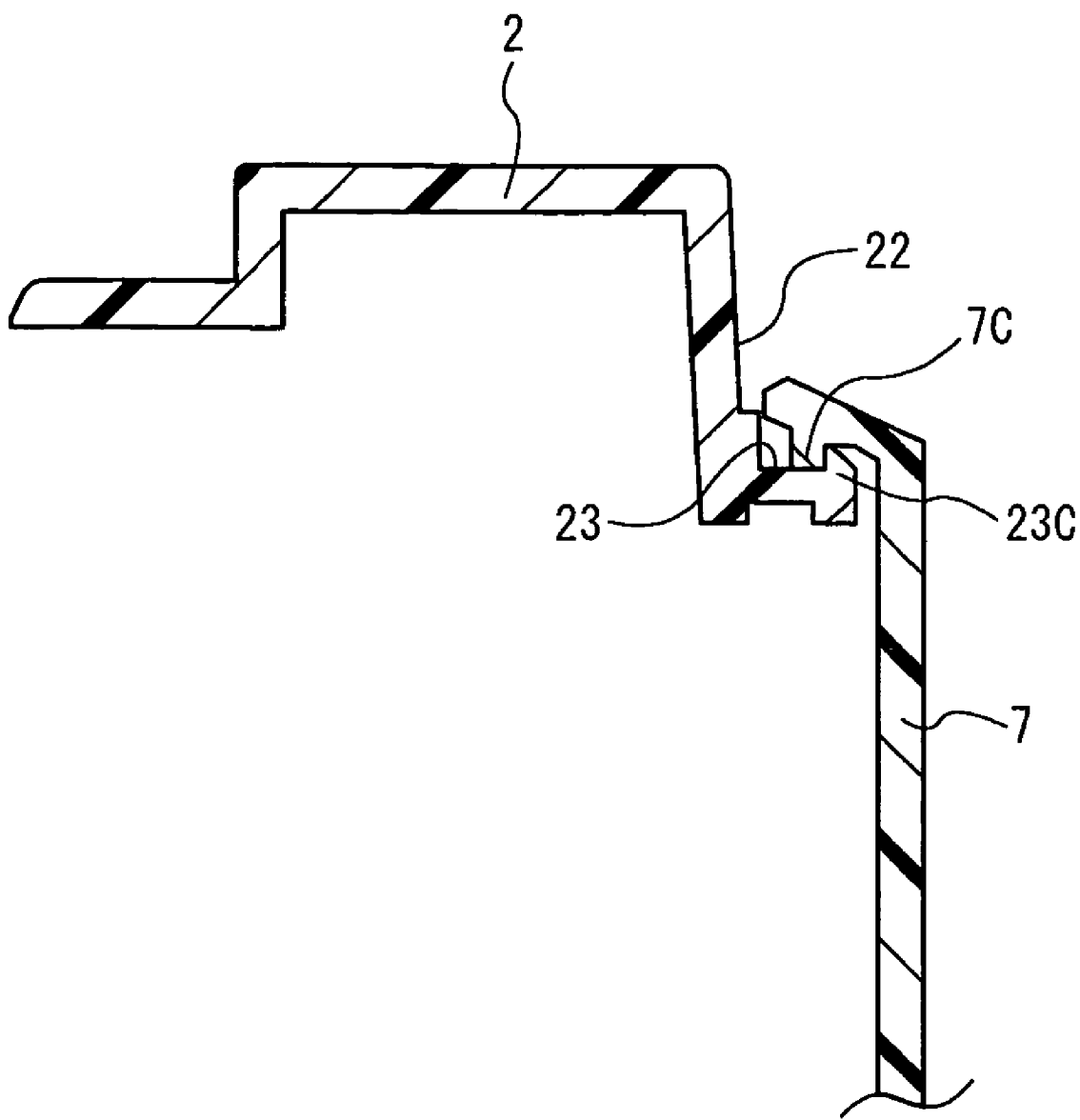
FIG. 23 is a sectional view taken along the plane D-D of the tape print apparatus 1 shown in FIG. 22.
Figure 24:
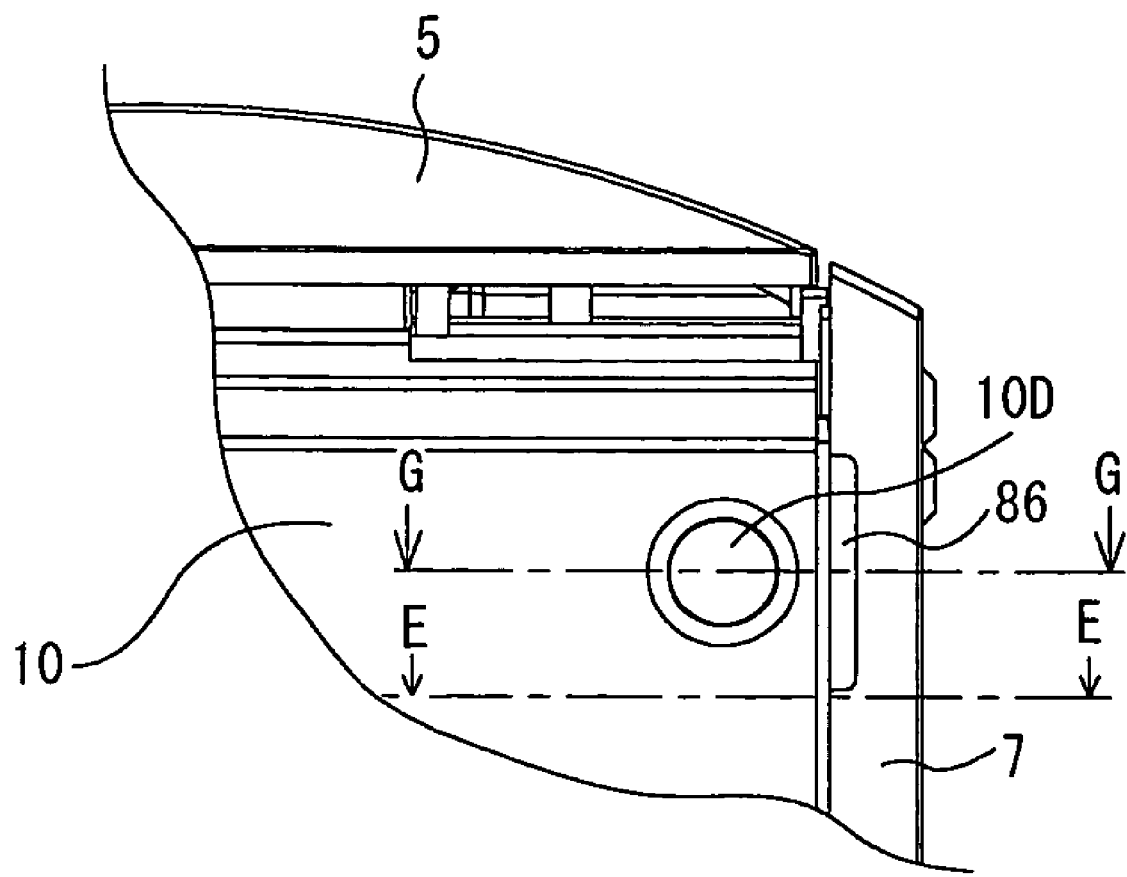
FIG. 24 is an enlarged view of the vicinity of a leg section 10D of a bottom cover 10 of the tape print apparatus 1.

As indicated by the partial sectional view of FIG. 18, a section in which an engaging protrusion 7D of the side cover 7 engages an engaging protrusion 23D of the intermediate cover 2 serves as an engaging section so that there exists no ventilation section. As indicated by FIG. 23, a section in which an engaging protrusion 7C of the side cover 7 engages an engaging protrusion 23C of the intermediate cover 2 serves as an engaging section so that there exists no ventilation section. That is, there exists no ventilation section in the engaging section in which the engaging protrusion of the side cover 7 engages the engaging protrusion of the intermediate cover 2. The gap 71 in the joining section between the intermediate cover 22 and the side cover 8 has the same structure.

Figure 19:
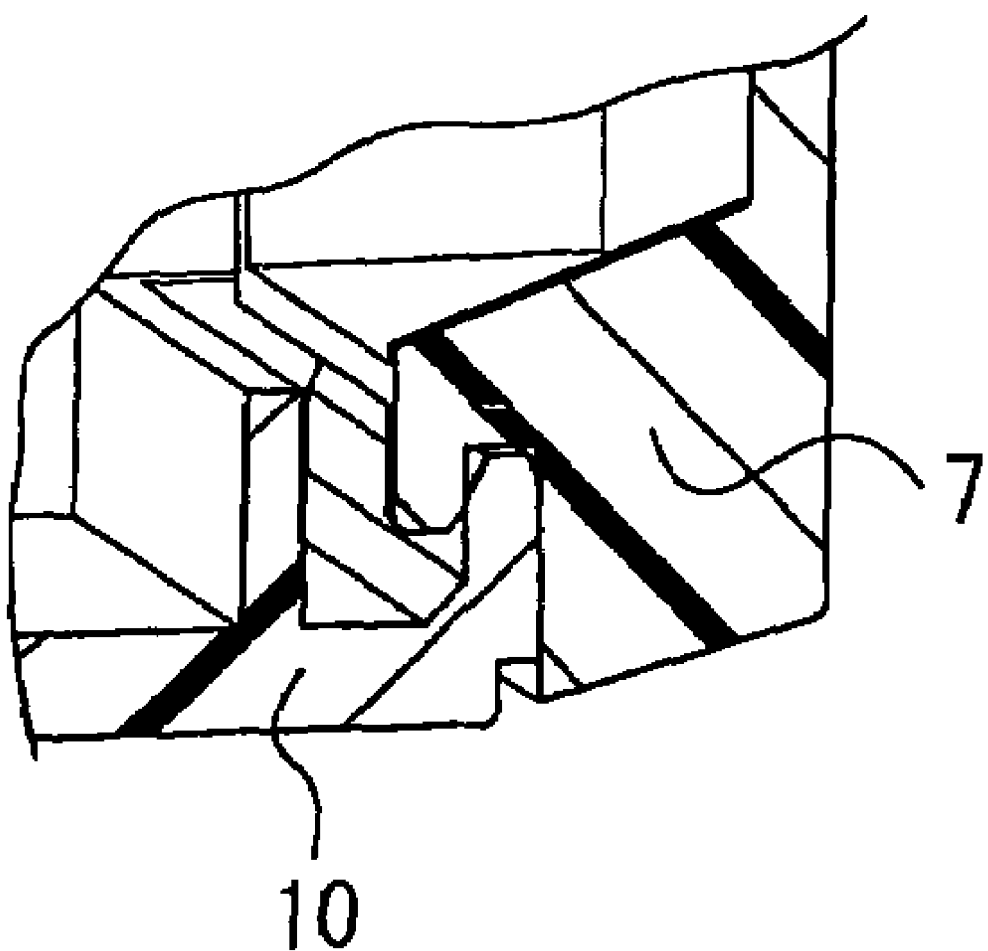
FIG. 19 is an enlarged view of a section K in FIG. 15.
Figure 25:
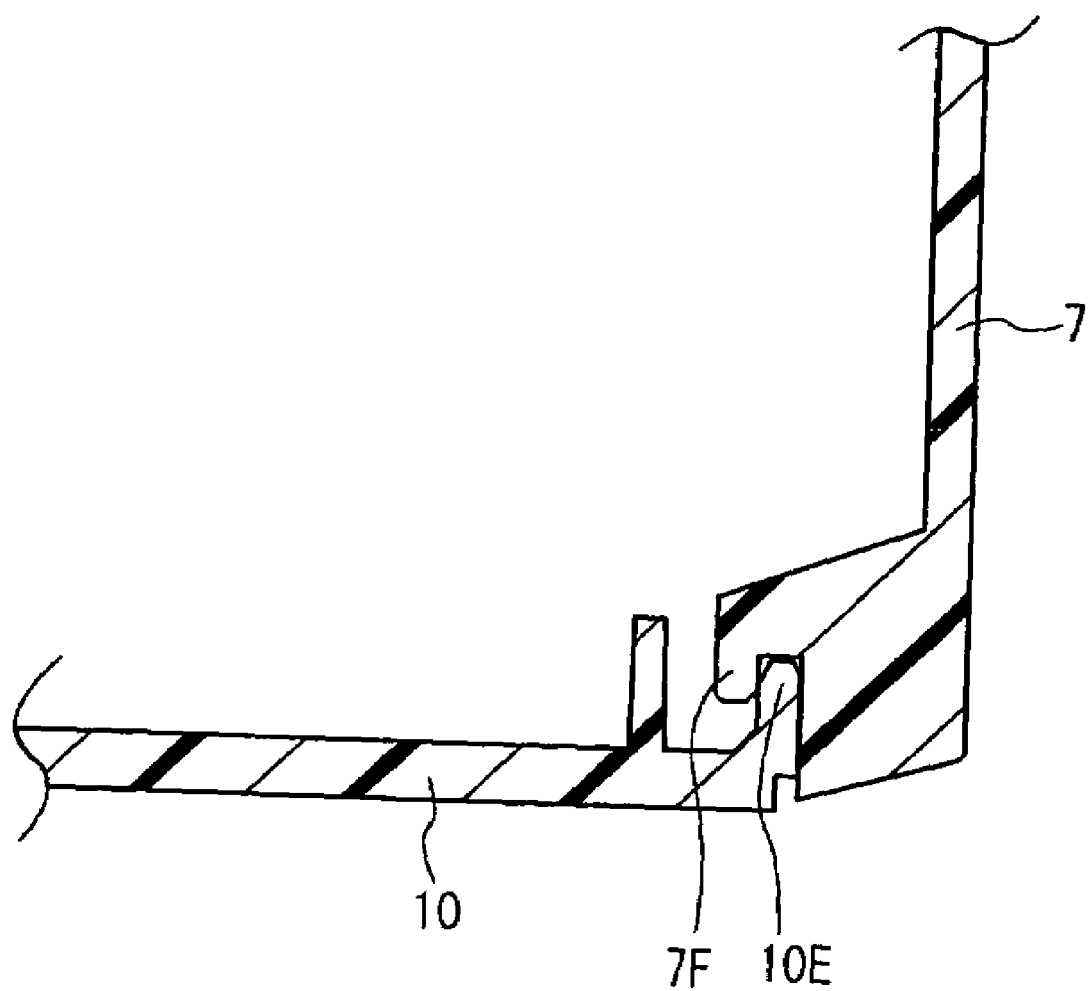
FIG. 25 is a sectional view taken along the plane E-E of the tape print apparatus 1 shown in FIG. 24.

As shown in FIG. 19, there exists no air introduction section in the engaging section in which the bottom cover 10 is joined to the side cover 7. Further, as shown in FIG. 25, there exists no air introduction section in the engaging section between the engaging protrusion 10E of the bottom cover 10 and the engaging protrusion 7F of the side cover 7. A section in which the bottom cover 10 is joined to the side cover 8 has the same structure.

Figure 20:
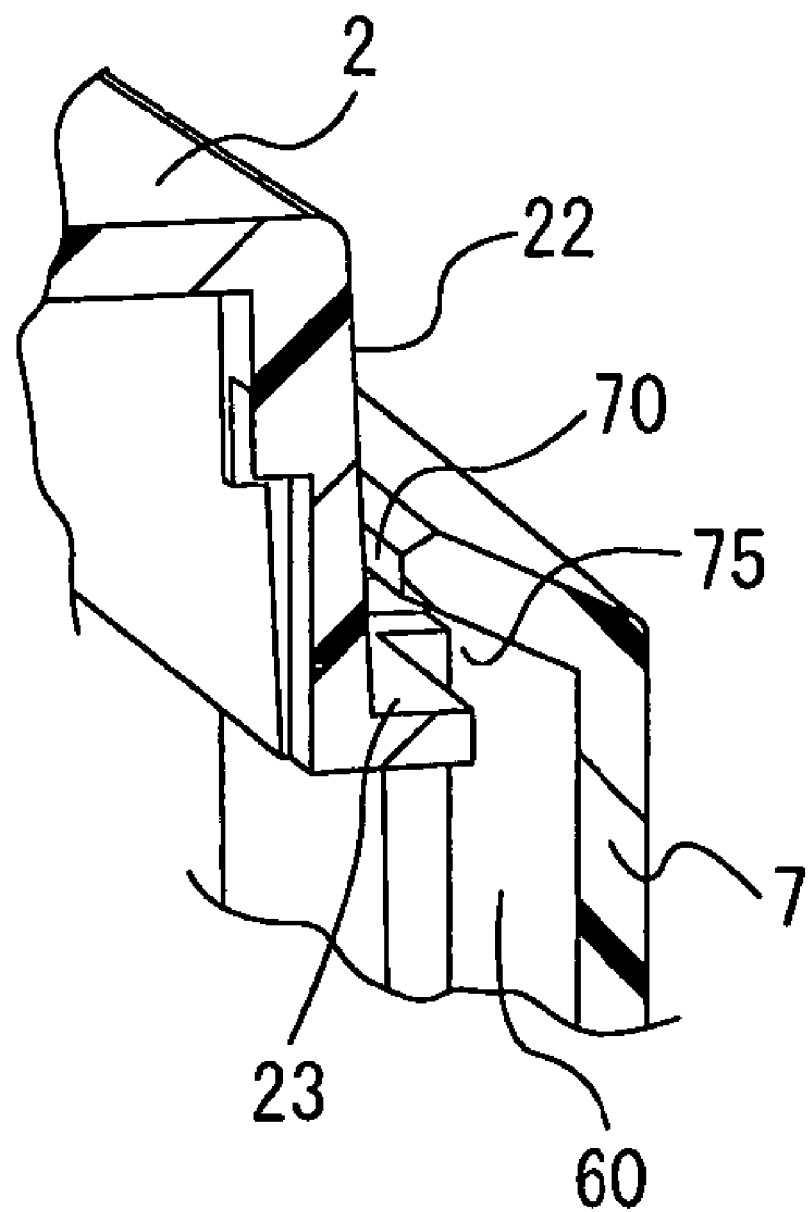
FIG. 20 is an enlarged view of a section L in FIG. 16.
Figure 26:
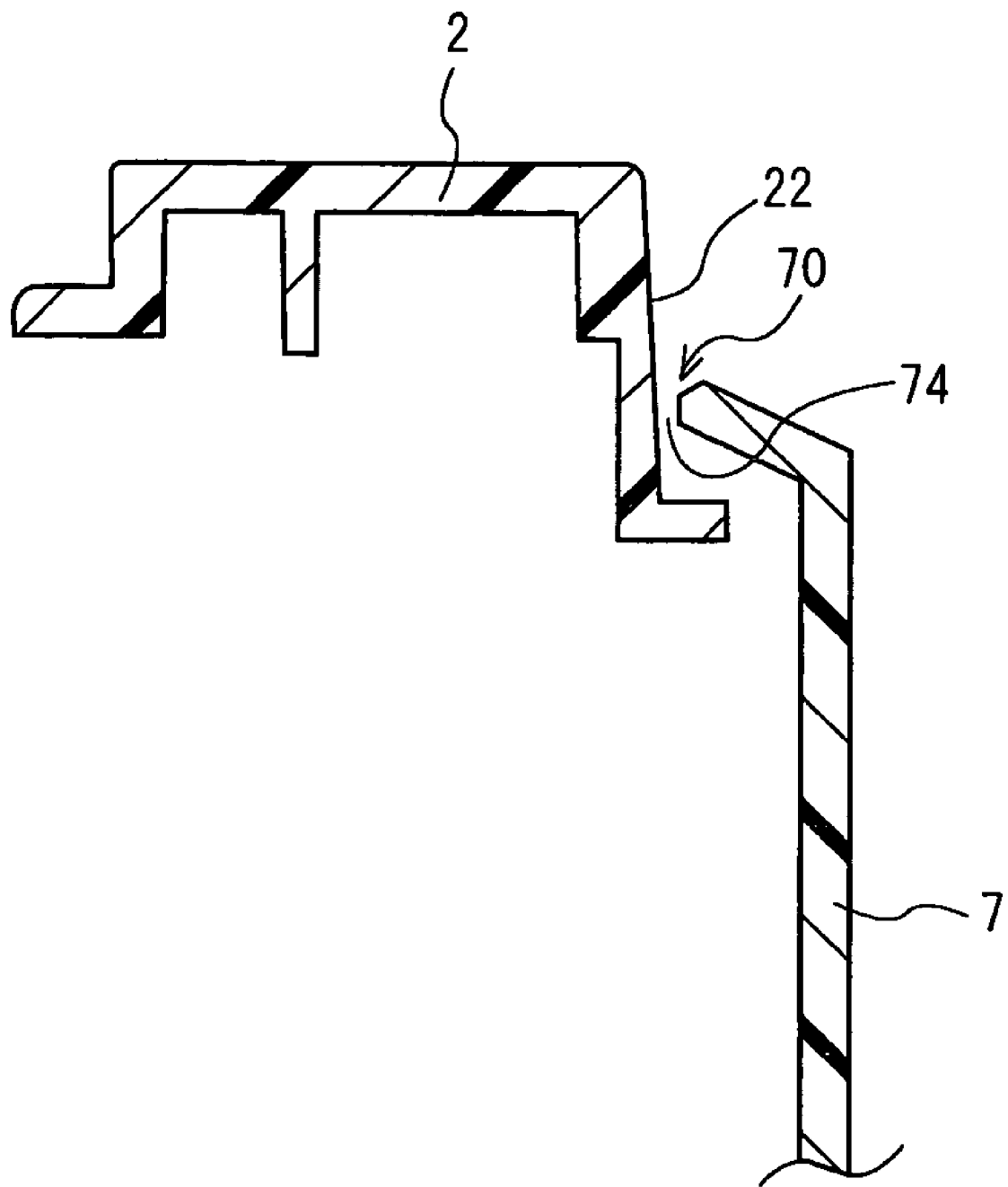
FIG. 26 is a sectional view taken along the plane F-F of the tape print apparatus 1 shown in FIG. 22.

However, as shown in FIG. 20, a ventilation section 75 is formed in a section having no engaging protrusion in the gap 70 in the joining section between the side cover 7 and the intermediate cover 2. As shown in FIG. 26, a ventilation section 74 is formed in a section having no engaging protrusion in the gap 70 in the joining section between the side cover 7 and the intermediate cover 2. Ventilation sections 72, 73, 76 are provided in a section having no engaging protrusion in the gap 70 in the other joining section between the side cover 7 and the intermediate cover 2. Thus, the sections other than the engaging section between the side cover 7 and the intermediate cover 2, serve as the ventilation section. The gap 71 in the joining section between the side cover 8 and intermediate cover 2 has the same structure.

Figure 21:
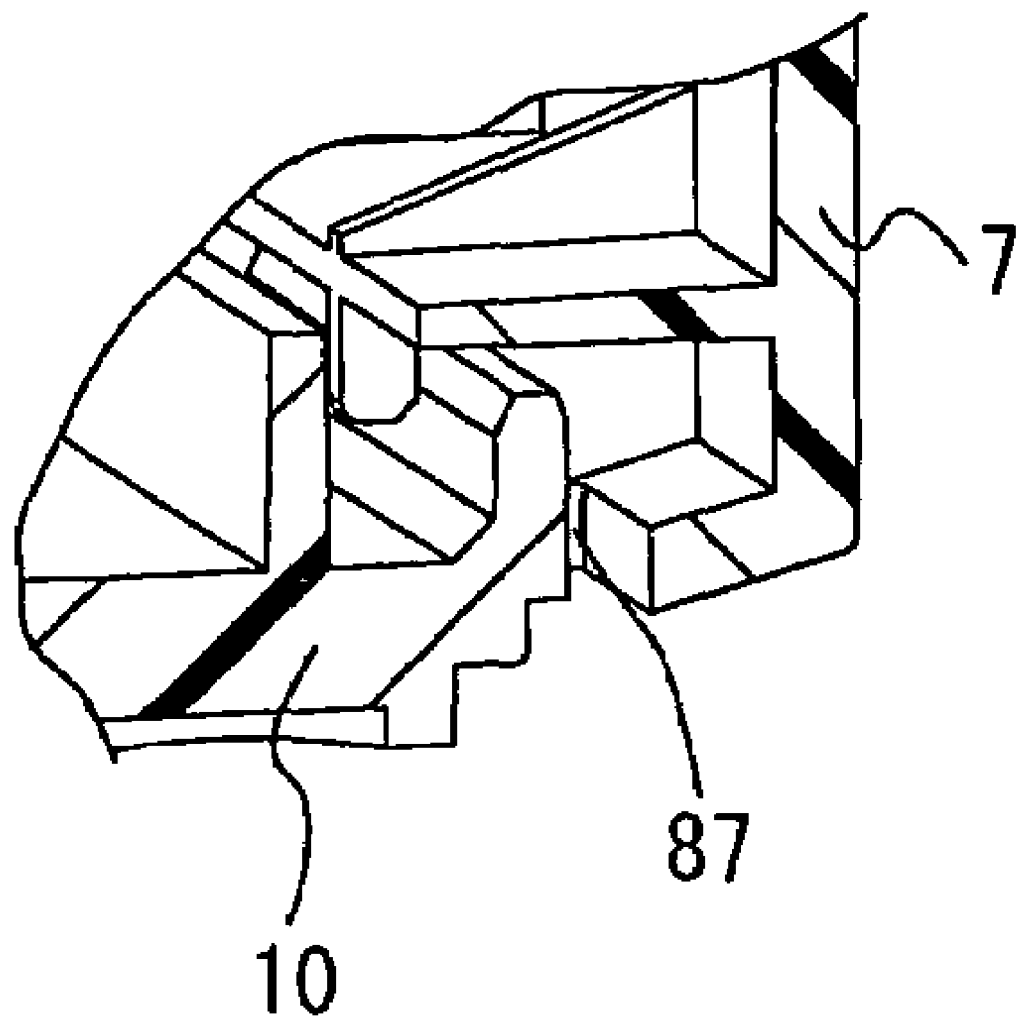
FIG. 21 is an enlarged view of a section M in FIG. 16.
Figure 22:
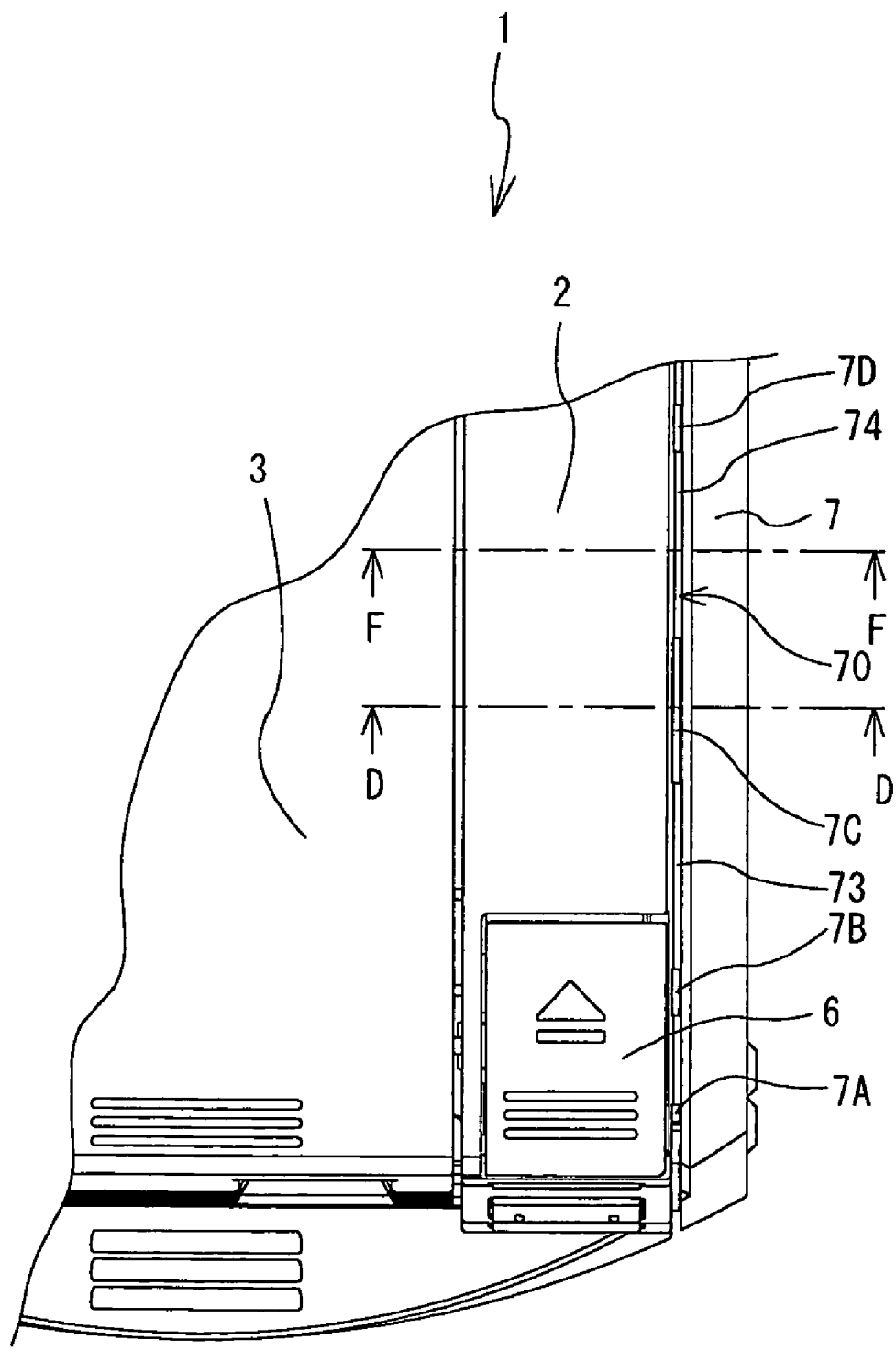
FIG. 22 is an enlarged view of the vicinity of an open button 6 of the tape print apparatus 1.
Figure 27:
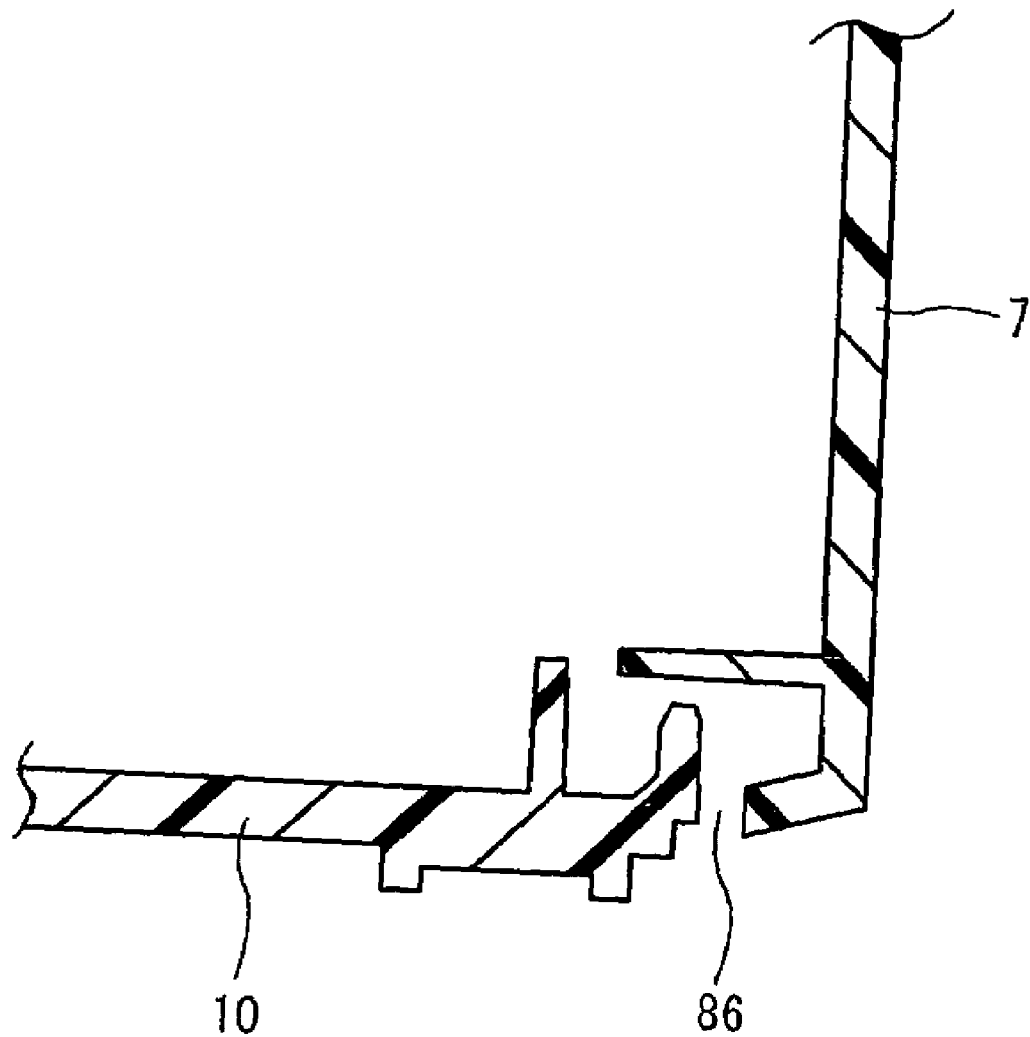
FIG. 27 is a sectional view taken along the plane G-G of the tape print apparatus 1 shown in FIG. 24.
Figure 28:
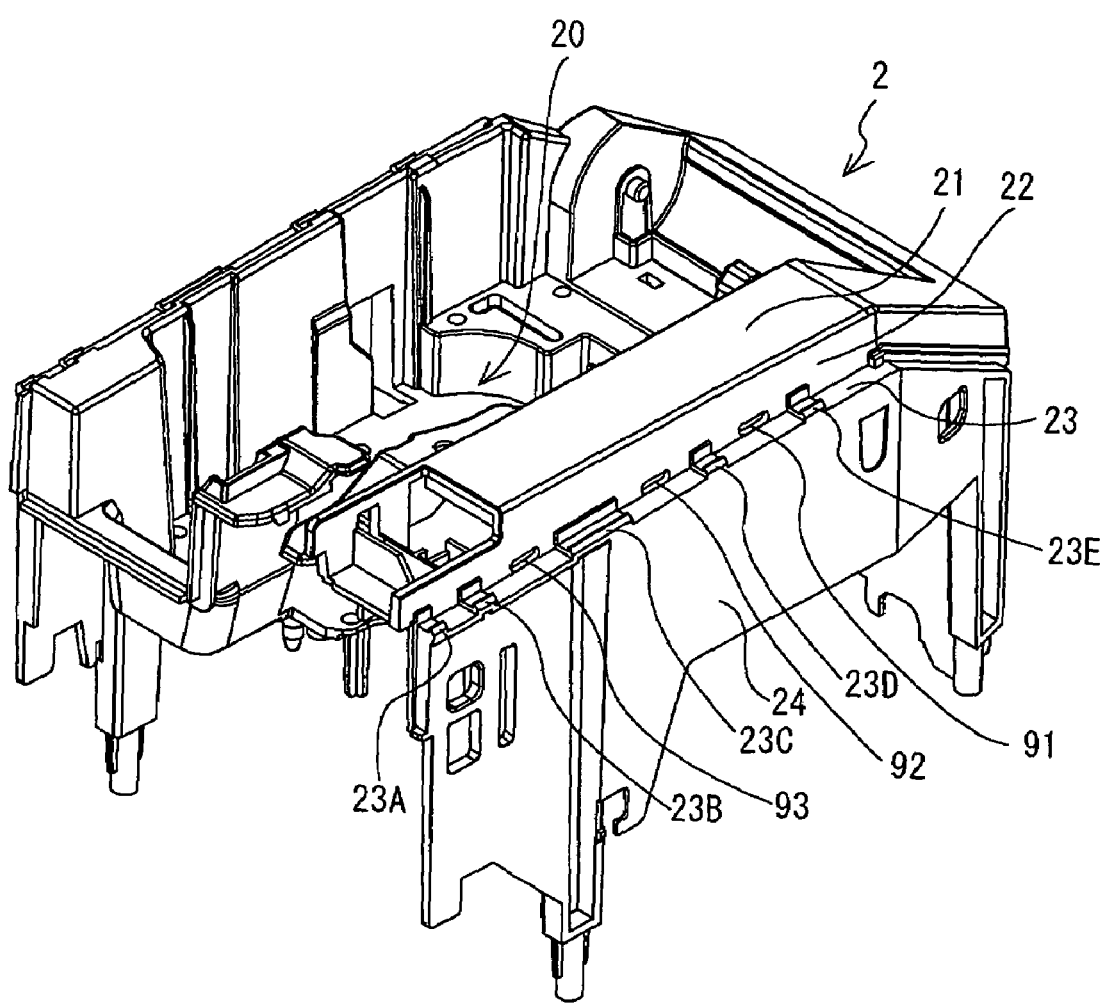
FIG. 28 is a perspective view of a modification of the intermediate cover 2.

As shown in FIG. 21, an air introduction section 87 is formed in a section having no engaging protrusion in the joining section between the bottom cover 10 and side cover 7. As shown in FIG. 27, an air introduction section 86 is formed in a section having no engaging protrusion in the joining section between the bottom cover 10 and side cover 7. Further, air introduction sections 88, 89 also are provided in sections having no engaging protrusion in the other joining section between the bottom cover 10 and side cover 7. The joining section between the bottom cover 10 and side cover 8 has the same structure.

Therefore, air warmed by heat generating sources, such as the thermal head 45, tape feeding motor 51, tape discharge motor 52, full cutter motor 53, half cutter motor 54 and the like that are provided in the case of the tape print apparatus 1 rises, passes through the gaps 60, 62 and is discharged through the ventilation sections 72-81 to the outside. In this case, because rising air current is generated by air warmed within the case, outside air is naturally introduced through the respective introduction sections 86-89, 82-85 on the bottom. Thus, heat does not build up within the case.

Further because no special ventilation hole needs to be provided in the surface (an easily visible section) of the tape print apparatus 1, the design of the case of the tape print apparatus 1 is never compromised (i.e., weakened by having vent holes or slots formed in it). The ventilation sections 72-81 can be provided at a location requiring the most ventilation, regardless of the internal structure, by changing positions of the respective engaging sections between the engaging protrusion 7A-7E and the engaging protrusion 23A-23E and positions of the respective engaging sections between the engaging protrusion 8A-8E and engaging protrusion 26A-26E.

The present invention is not restricted to the above described embodiments but may be modified in various ways. For example, it is permissible to provide ventilation holes 91-93 in the upper side face 22 of the right side wall 24 of the intermediate cover 2, and discharge air inside the intermediate cover through the ventilation section from the ventilation holes 91-93 without allowing air to pass through the gap 60 between the right side wall 24 of the intermediate cover 2 and the rear face of the side cover 7. The present invention is not restricted to such an apparatus in which the side covers 7, 8 are joined to the side faces of the intermediate cover 2, but if the case is constituted of two or more components, the ventilation section or introduction section of the present invention can be provided on match sections between those respective components.

The present invention can be applied to not only the above-described tape print apparatus but also various kinds of print apparatus such as ink jet printer, laser printer and various kinds of electronic apparatus such as TV, personal computer if a heat generating source is contained inside. Additionally, the present invention can be applied to not only such electronic apparatus but also to the cases of various kinds of machines each accommodating a heat generating source inside such as sewing machine, machine tool.

While the invention has been described with reference to exemplary embodiments, it is to be understood that the invention is not limited to the exemplary embodiments or constructions. While the various elements of the exemplary embodiments are shown in various combinations and configurations, which are exemplary, other combinations and configurations, including more, less or only a single element, are also within the spirit and scope of the invention.

What is claimed is:

1. A case having a ventilation system for ventilating a heat generation source disposed in the case, the case comprising:
    a first portion including a first peripheral edge;
    a second portion joined to the first portion, the second portion including a second peripheral edge;
    a plurality of first engaging members provided on the first peripheral edge of the first portion;
    a plurality of second engaging members provided on the second peripheral edge of the second portion and engaged with the plurality of first engaging members such that no ventilation sections exist at an engaging section where one of the plurality of first engaging members engages with one of the plurality of second engaging members; and
    a plurality of ventilation sections each located at the first peripheral edge and the second peripheral edge between an adjacent pair of the plurality of engaged first and second engaging members to provide a ventilation path for heated air to exit the case.

2. The case according to claim 1, wherein each of the plurality of ventilation sections are spaces formed between the adjacent pair of the plurality of first and second engaging members.

3. The case according to claim 1, wherein:
    the second portion is joined to a side wall of the first portion;
    a gap is formed between the side wall of the first portion and a rear face of the second portion; and the gap communicates with the plurality of ventilation sections.

4. The case according to claim 1, wherein the second portion is immovably fixed to the first portion.

5. The case according to claim 1, wherein the first and second portions collectively enclose an internal chamber of the case.

6. The case according to claim 5, further comprising a print head disposed within the internal chamber of the case, wherein the print head is the heat generation source.

7. The case according to claim 6, wherein the print head is a thermal head.

8. The case according to claim 5, further comprising a motor disposed within the internal chamber of the case, wherein the motor is the heat generation source.

9. A case having a ventilation system for ventilating a heat generation source disposed in the case, the case comprising:
   a first portion including a first peripheral edge and a plurality of first engaging members;
   a second portion including a second peripheral edge and a plurality of second engaging members;
   the first engaging members joined to the second engaging members to join the first portion to the second portion such that no ventilation sections exist at an engaging section where one of the plurality of first engaging members engages with one of the plurality of second engaging members, the joined first and second portions collectively enclosing an internal chamber of the case; and
   a plurality of ventilation sections each located at the first peripheral edge and the second peripheral edge between an adjacent pair of the plurality of joined first and second engaging members to provide a ventilation path for heated air to exit from the internal chamber to the outside of the case.

10. The case according to claim 9, wherein a gap is provided between surfaces of the first and second portions when the first and second engaging members are joined to each other, and the ventilation sections communicate with the gap.

11. The case according to claim 10, wherein the gap is visible from the outside of the case, and the first and second engaging members are hidden from view from the outside of the case.

12. The case according to claim 11, wherein each of the plurality of ventilation sections are spaces formed between the adjacent pair of the plurality of first and second engaging members.

13. The case according to claim 9, wherein:
   the second portion is joined to a side wall of the first portion;
   a gap is formed between the side wall of the first portion and a rear face of the second portion; and
   the gap communicates with the plurality of ventilation sections.

14. The case according to claim 9, wherein the second portion is immovably fixed to the first portion.

15. The case according to claim 9, further comprising a print head disposed within the internal chamber of the case, wherein the print head is the heat generation source.

16. The case according to claim 15, wherein the print head is a thermal head.

17. The case according to claim 9, further comprising a motor disposed within the internal chamber of the case, wherein the motor is the heat generation source.

* * * * *